United States Patent
Inoue et al.

(10) Patent No.: US 11,133,191 B2
(45) Date of Patent: *Sep. 28, 2021

(54) METHOD OF PRODUCING ETCHING MASK, ETCHING MASK PRECURSOR, AND OXIDE LAYER, AND METHOD OF MANUFACTURING THIN FILM TRANSISTOR

(71) Applicants: Japan Advanced Institute of Science and Technology, Ishikawa (JP); Sumitomo Seika Chemicals Co., Ltd., Hyogo (JP)

(72) Inventors: Satoshi Inoue, Nagano (JP); Tatsuya Shimoda, Ishikawa (JP); Kazuhiro Fukada, Hiroshima (JP); Kiyoshi Nishioka, Hyogo (JP); Nobutaka Fujimoto, Osaka (JP); Masahiro Suzuki, Hyogo (JP)

(73) Assignees: JAPAN ADVANCED INSTITUTE OF SCIENCE AND TECHNOLOGY, Ishikawa (JP); SUMITOMO SEIKA CHEMICALS CO., LTD., Hyogo (JP)

( * ) Notice: Subject to any disclaimer, the term of this patent is extended or adjusted under 35 U.S.C. 154(b) by 55 days.

This patent is subject to a terminal disclaimer.

(21) Appl. No.: 16/586,021

(22) Filed: Sep. 27, 2019

(65) Prior Publication Data

US 2020/0027743 A1 Jan. 23, 2020

Related U.S. Application Data

(62) Division of application No. 15/565,976, filed as application No. PCT/JP2016/057986 on Mar. 14, 2016, now abandoned.

(30) Foreign Application Priority Data

Apr. 16, 2015 (JP) .................................. 2015-084467

(51) Int. Cl.
  *H01L 21/3065* (2006.01)
  *H01L 29/66* (2006.01)
  (Continued)

(52) U.S. Cl.
  CPC ...... *H01L 21/3065* (2013.01); *H01L 21/3086* (2013.01); *H01L 27/1288* (2013.01);
  (Continued)

(58) Field of Classification Search
  None
  See application file for complete search history.

(56) References Cited

U.S. PATENT DOCUMENTS

| 5,412,062 A | 5/1995 | Power et al. |
| 2005/0245087 A1 | 11/2005 | Sasagawa et al. |

(Continued)

FOREIGN PATENT DOCUMENTS

| CN | 101546124 A | 2/2015 |
| JP | H0517300 A | 1/1993 |

(Continued)

OTHER PUBLICATIONS

"Chinese Office Action", dated Sep. 27, 2020 (Sep. 27, 2020), for Chinese Application No. 201680022181.5, 9pgs.

(Continued)

*Primary Examiner* — Allan W. Olsen
(74) *Attorney, Agent, or Firm* — Buckley, Maschoff & Talwalkar LLC

(57) ABSTRACT

The etching mask 80 for screen printing according to one embodiment of the present invention includes aliphatic polycarbonate. Further, the method of producing an oxide layer (the channel 44) according to one embodiment of the present invention includes: an etching-mask forming step of forming a pattern of the etching mask 80 including aliphatic polycarbonate; a contact step of, after the etching-mask (Continued)

forming step, contacting the oxide layer with a solution for dissolving a portion of the oxide layer (the channel 44) which is not protected by the etching mask 80; and a heating step of, after the contact step, heating the oxide layer (the channel 44) and the etching mask 80 to or above a temperature at which the etching mask 80 is decomposed.

5 Claims, 18 Drawing Sheets

(51) Int. Cl.
  *H01L 27/12* (2006.01)
  *H01L 29/786* (2006.01)
  *H01L 21/308* (2006.01)

(52) U.S. Cl.
  CPC ...... *H01L 29/66969* (2013.01); *H01L 29/786* (2013.01); *H01L 29/7869* (2013.01)

(56) References Cited

U.S. PATENT DOCUMENTS

| | | | | |
|---|---|---|---|---|
| 2008/0182011 | A1* | 7/2008 | Ng | H05K 1/095 427/99.4 |
| 2009/0246469 | A1 | 10/2009 | Kawashima et al. | |
| 2014/0196502 | A1 | 7/2014 | Masuda et al. | |
| 2016/0181098 | A1* | 6/2016 | Inoue | H01L 21/02554 257/43 |
| 2016/0315198 | A1* | 10/2016 | Inoue | C09D 169/00 |
| 2017/0117393 | A1 | 4/2017 | Inoue et al. | |
| 2017/0335461 | A1* | 11/2017 | Shimoda | H01L 21/02565 |
| 2019/0041744 | A1* | 2/2019 | Inoue | B29C 59/02 |
| 2019/0088501 | A1* | 3/2019 | Inoue | H01L 29/66969 |

FOREIGN PATENT DOCUMENTS

| | | |
|---|---|---|
| JP | 106510809 A | 12/1994 |
| JP | 2005340800 A | 12/2005 |
| JP | 2012129325 A | 7/2012 |
| WO | 2015/019771 A1 | 2/2015 |

OTHER PUBLICATIONS

"English-language Translation of Chinese Office Action", dated Sep. 27, 2020 (27.09.2020), for Chinese Application No. 201680022181 5, 9pgs.
"EP Office Action", dated Jun. 12, 2020 (Jun. 12, 2020), for European Application No. 16779856.0—1230, 3pgs.
"Japanese Office Action", dated Jan. 6, 2020, for Japanese Application No. 2017-512237, 4pgs.
English-language Translation of Japanese Office Action, dated Jan. 6, 2020, for Japanese Application No. 2017-512237, 3pgs.
"Japanese Office Action", dated Jul. 5, 2019, TIPO, for Japanese Application No. 105110240, 5pgs.
English-language Translation of Japanese Office Action, dated Jul. 5, 2019, TIPO, for Japanese Application No. 105110240, 4pgs.
"Second Chinese Office Action", dated May 7, 2021 (May 7, 2021), for Chinese Application No. 201680022181.5, 6pgs.
"English-language Translation of Second Chinese Office Action", dated May 7, 2021 (May 7, 2021), for Chinese Application No. 201680022181.5, 10pgs.

* cited by examiner

[Fig. 1]
(1) 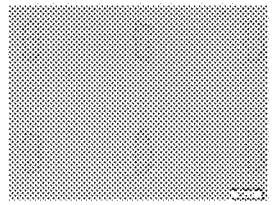  (7) 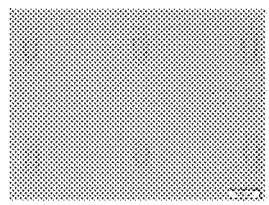  (8) 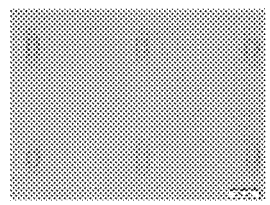
[Fig. 2A]
(5) 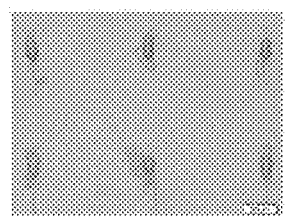  (9) 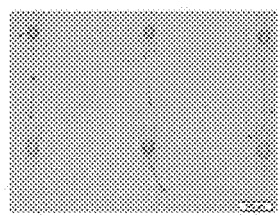  String-like body (10) 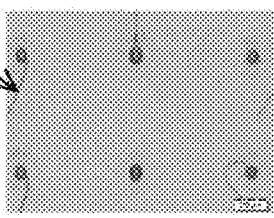

[Fig. 2B]
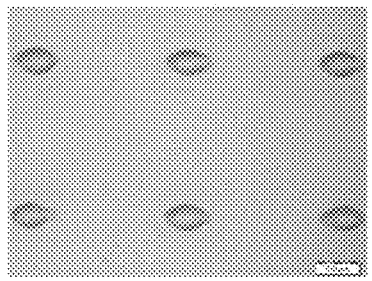 (9)
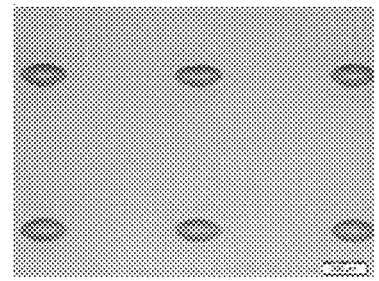 (10)
[Fig. 3A]
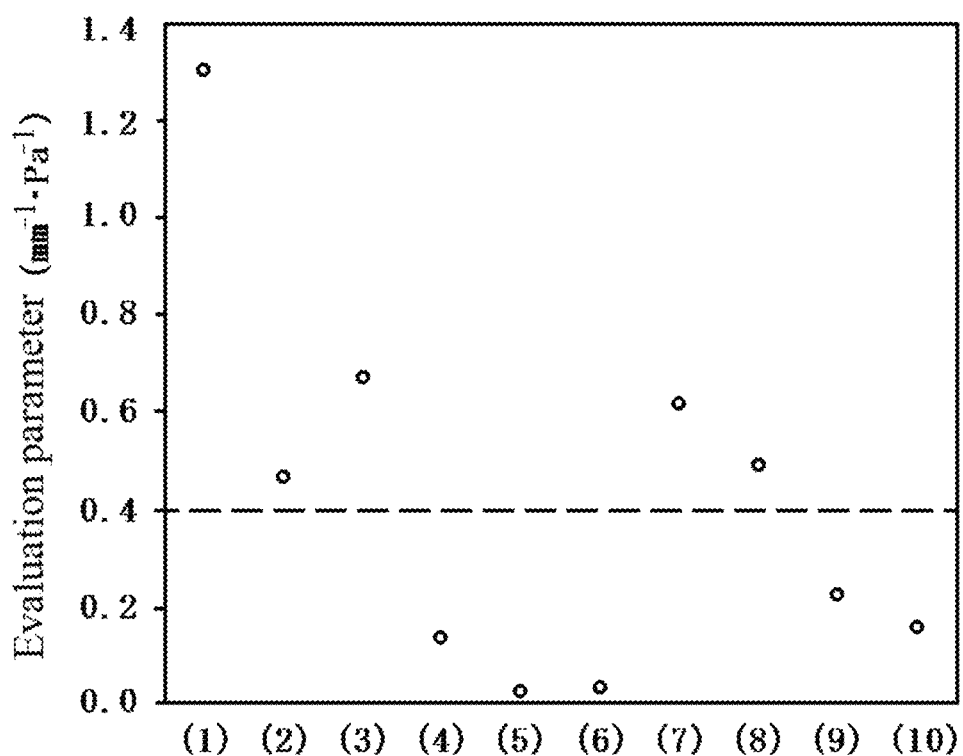

[Fig. 3B]
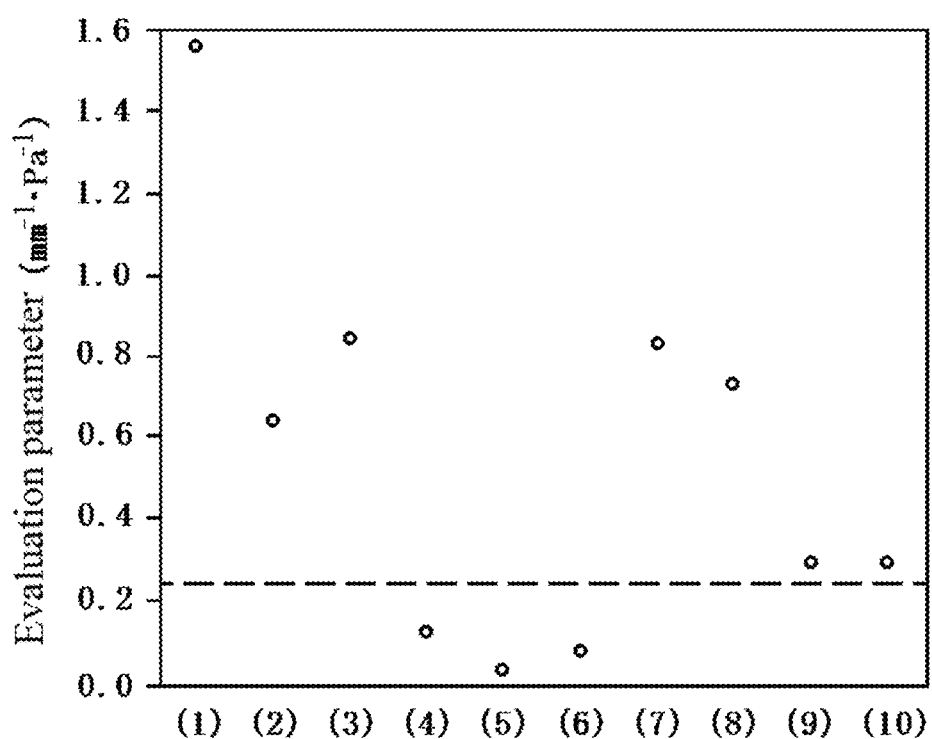

[Fig. 4A]
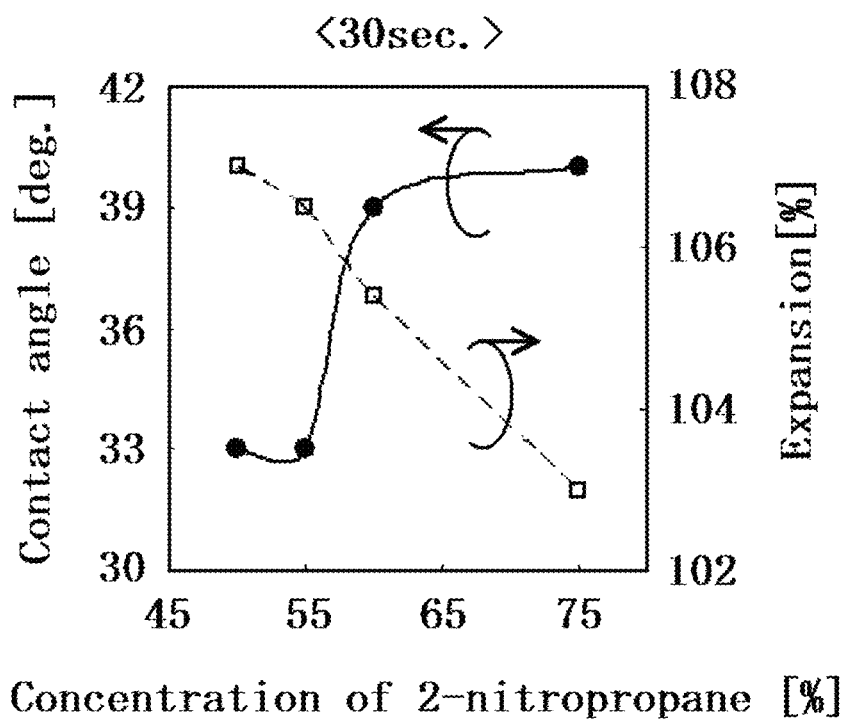
[Fig. 4B]
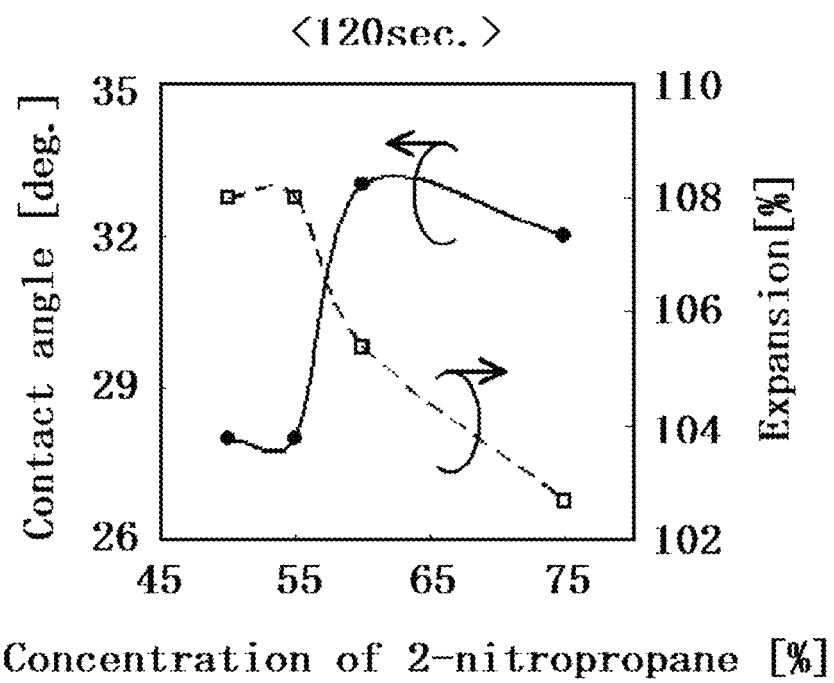

[Fig. 5]
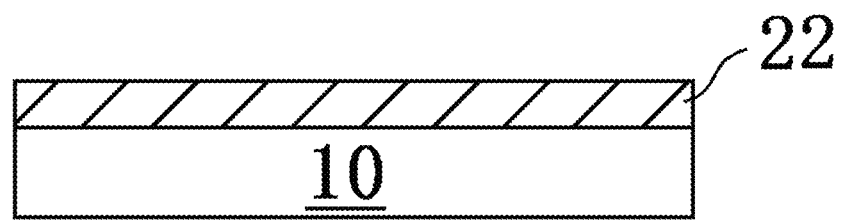
[Fig. 6]
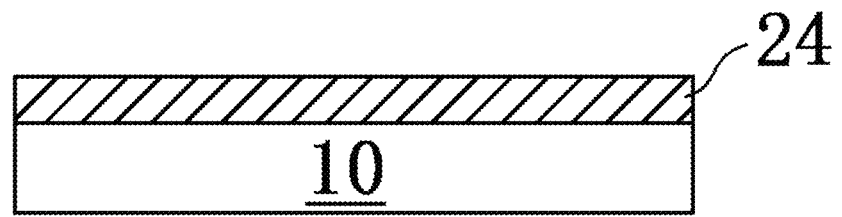

[Fig. 7]
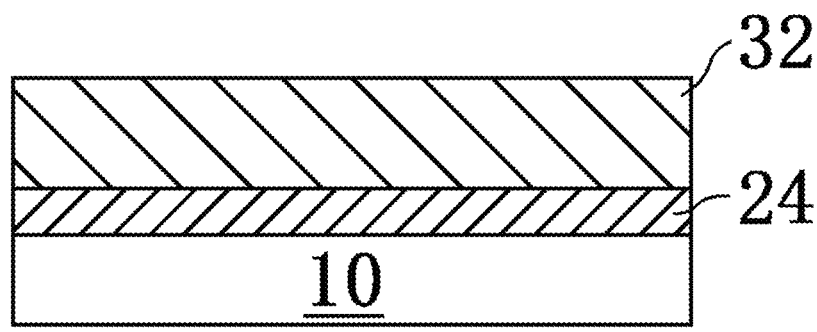
[Fig. 8]
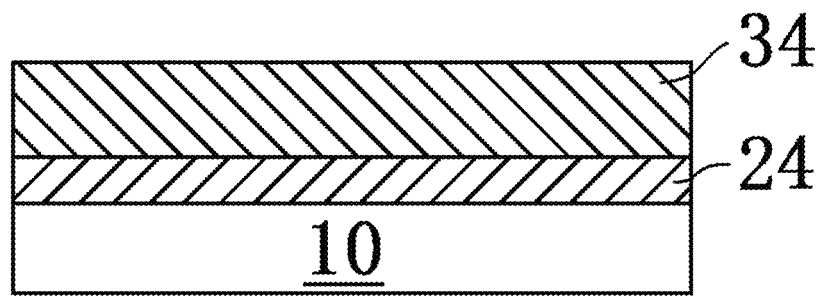

[Fig. 9A]
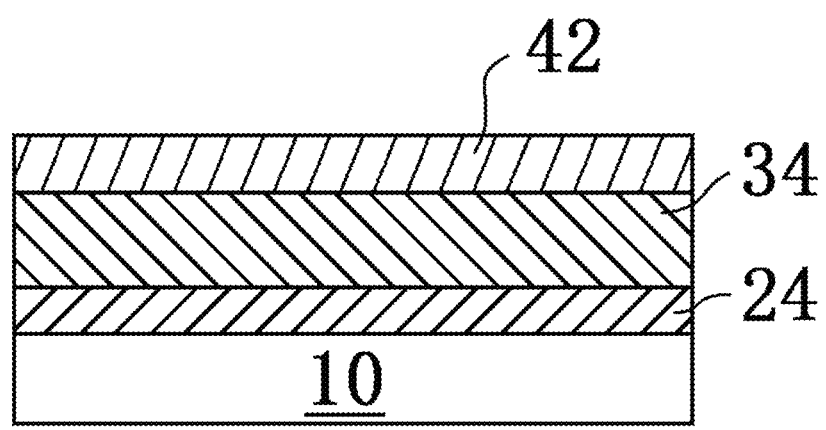
[Fig. 9B]
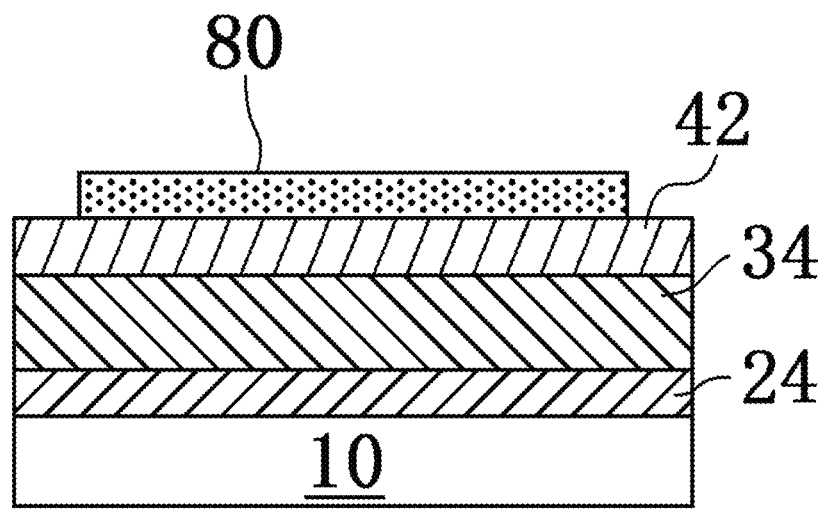

[Fig. 9C]
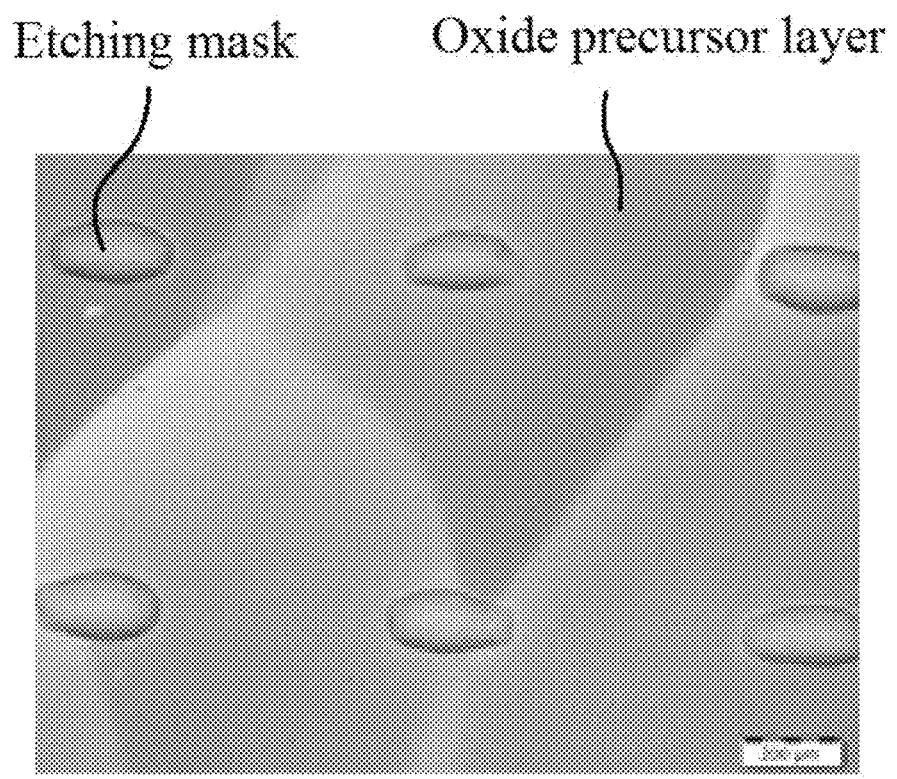

[Fig. 9D]
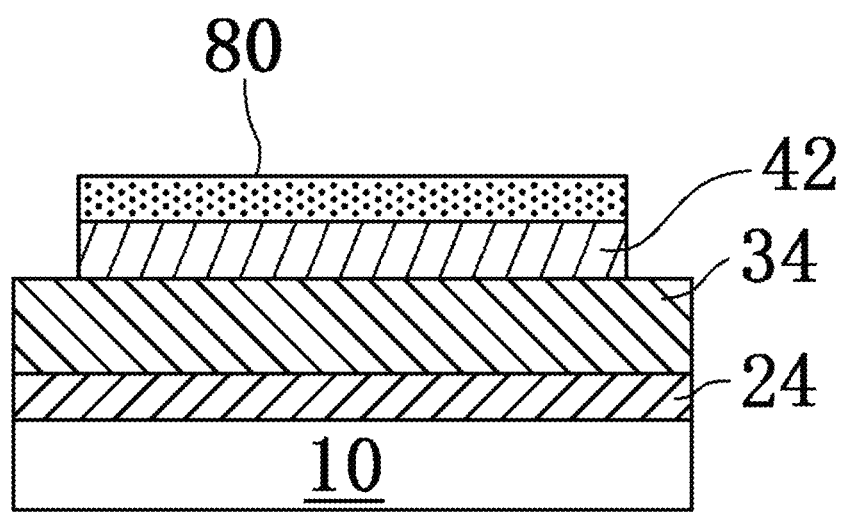

[Fig. 9E]
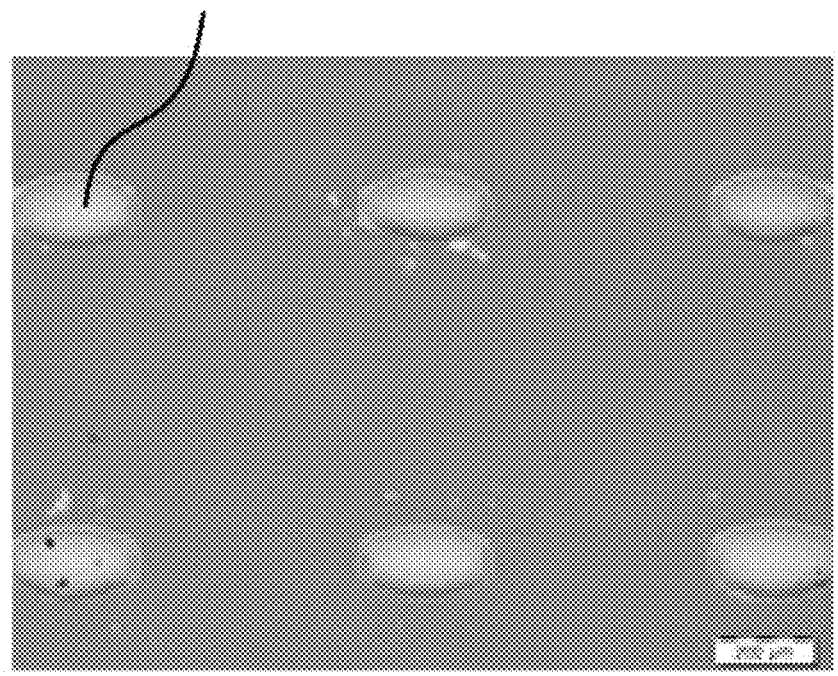

[Fig. 10A]
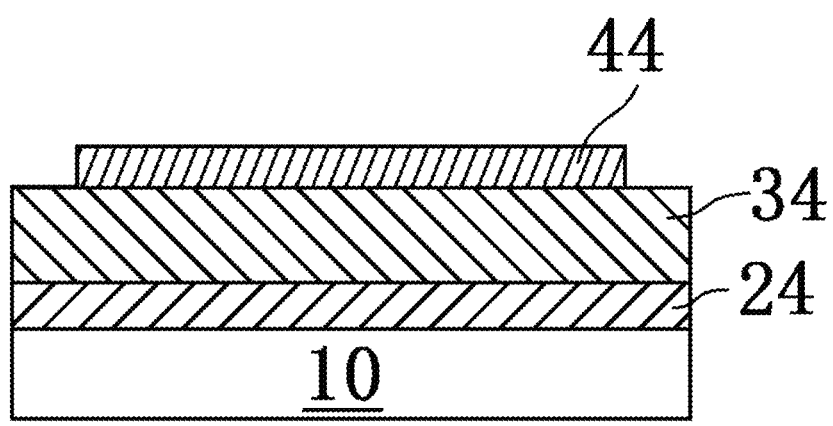

[Fig. 10B]
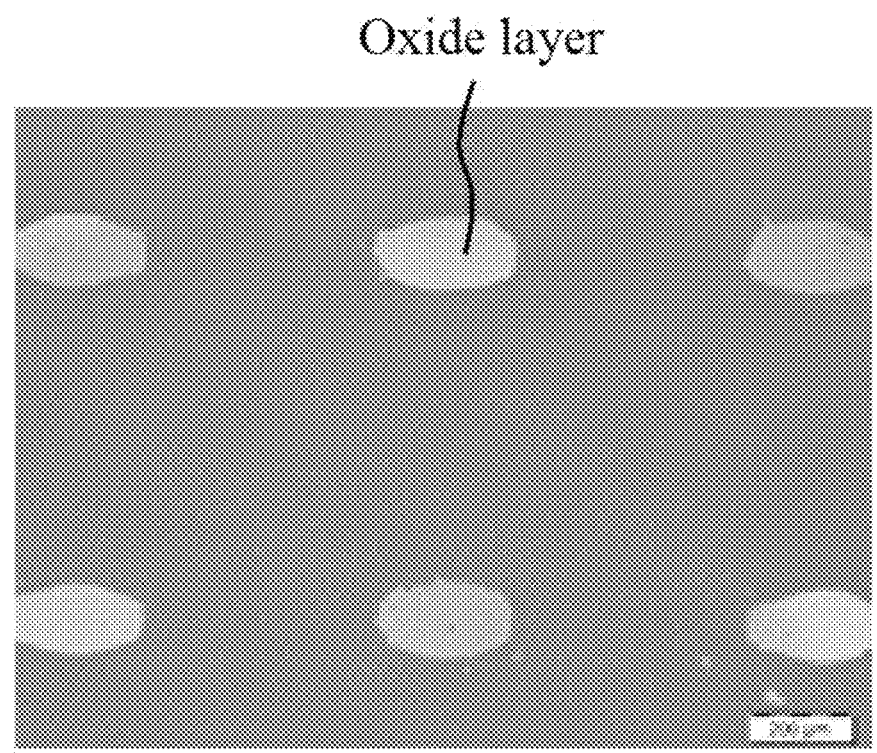
[Fig. 11]
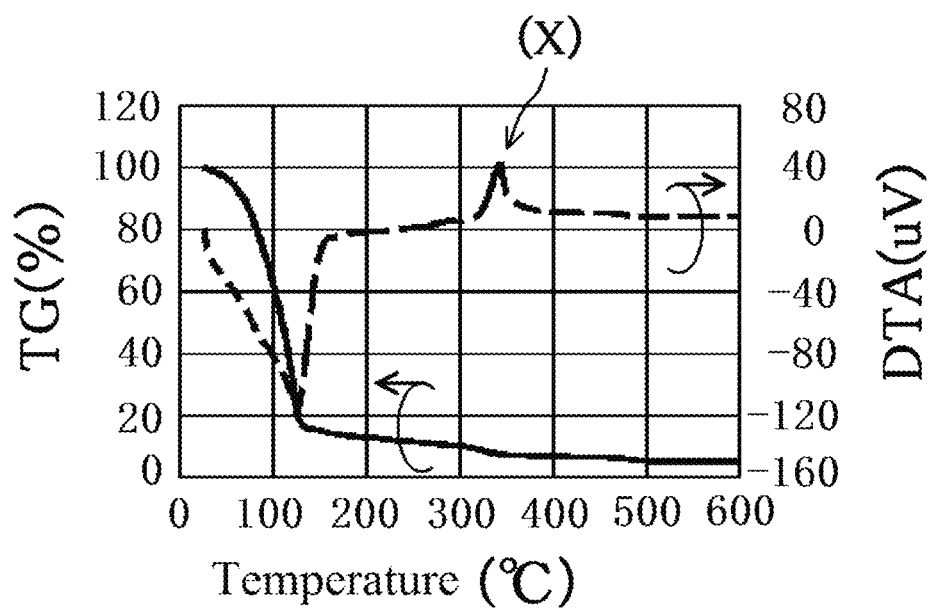

[Fig. 12]
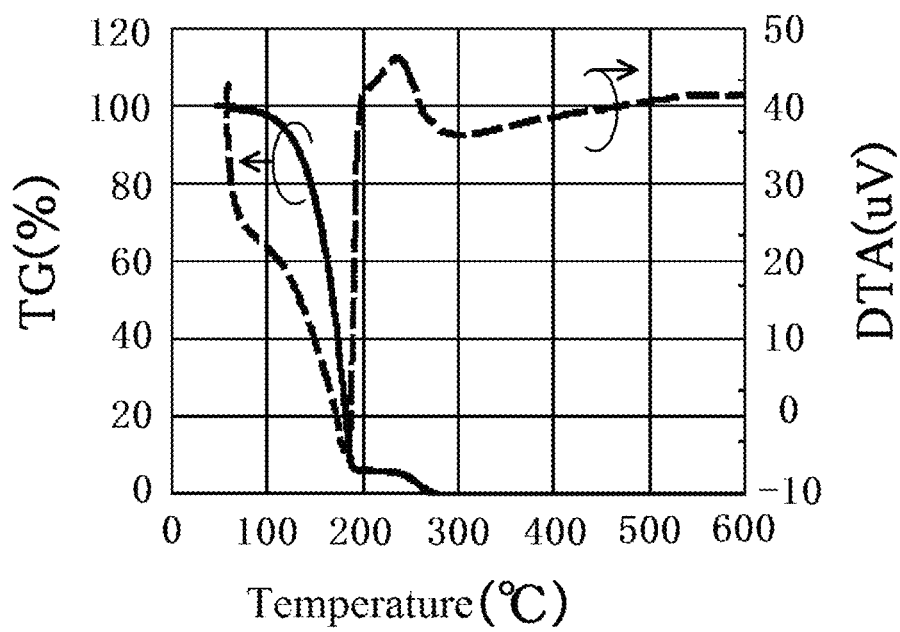
[Fig. 13]
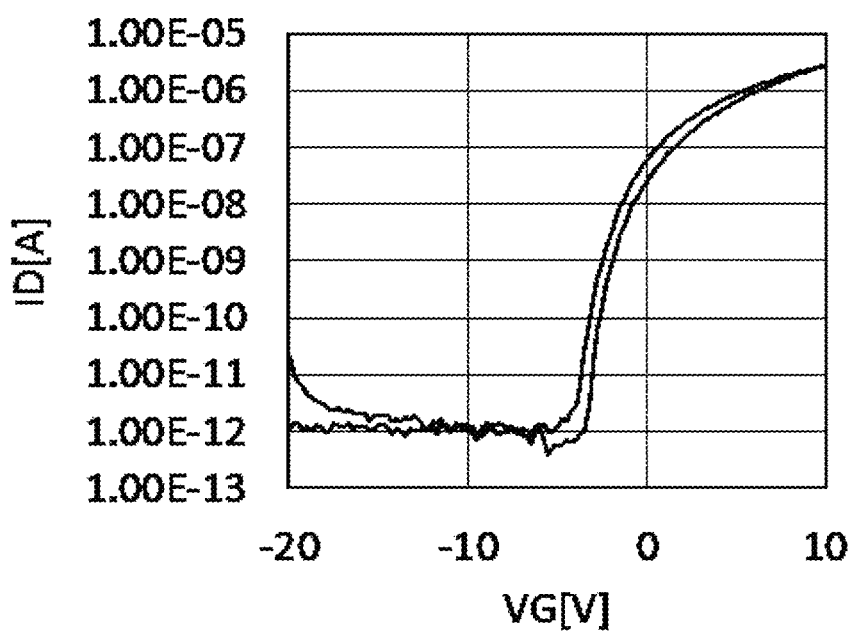

[Fig. 14]
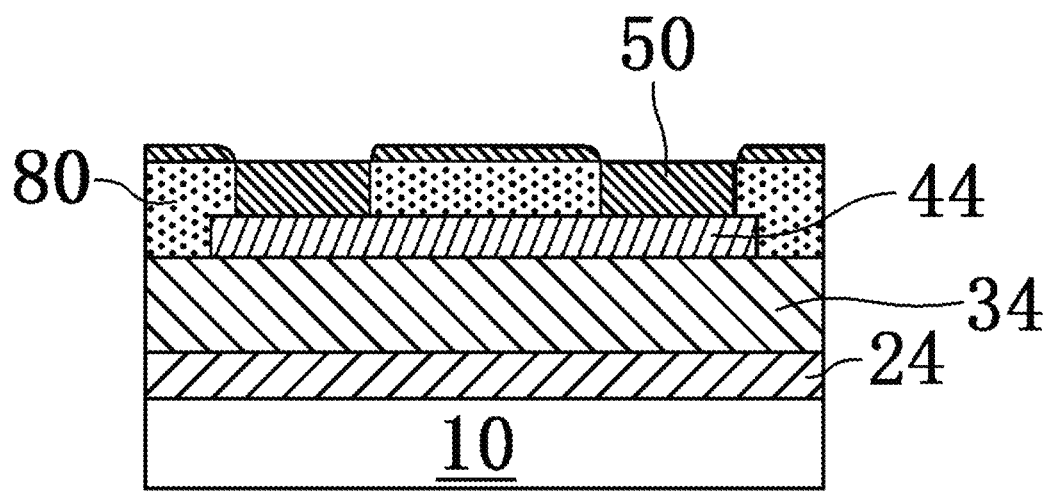
[Fig. 15]
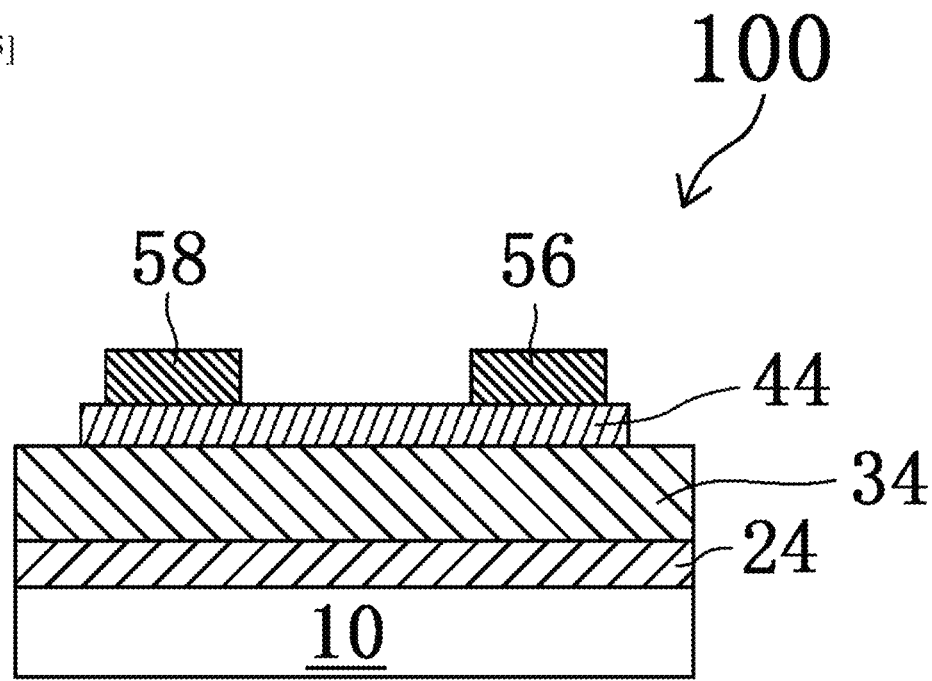

[Fig. 16A]
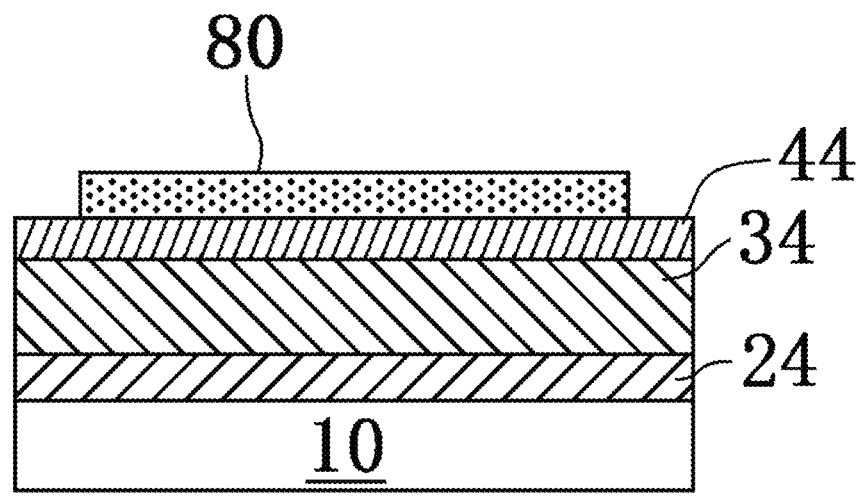
[Fig. 16B]
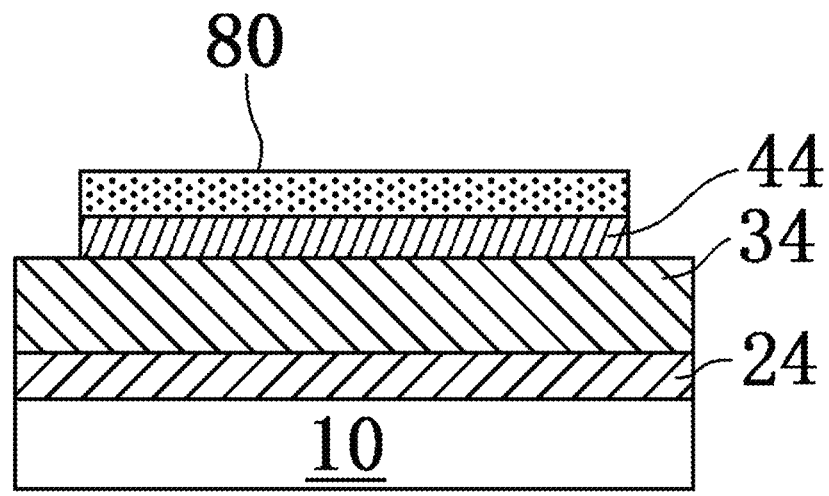

[Fig. 17A]
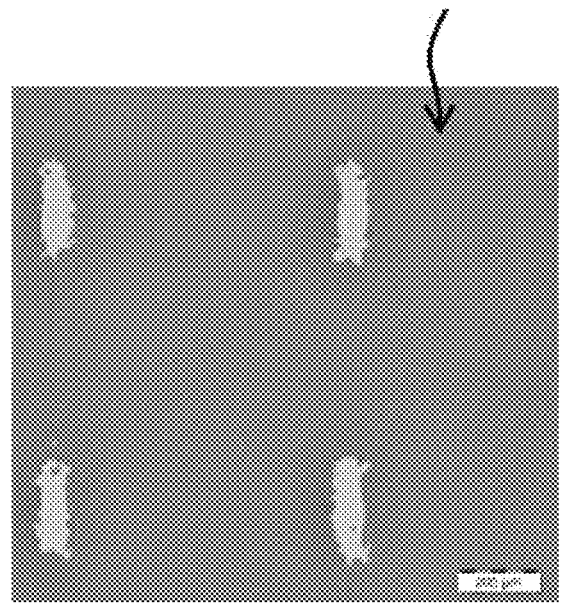

[Fig. 17B]
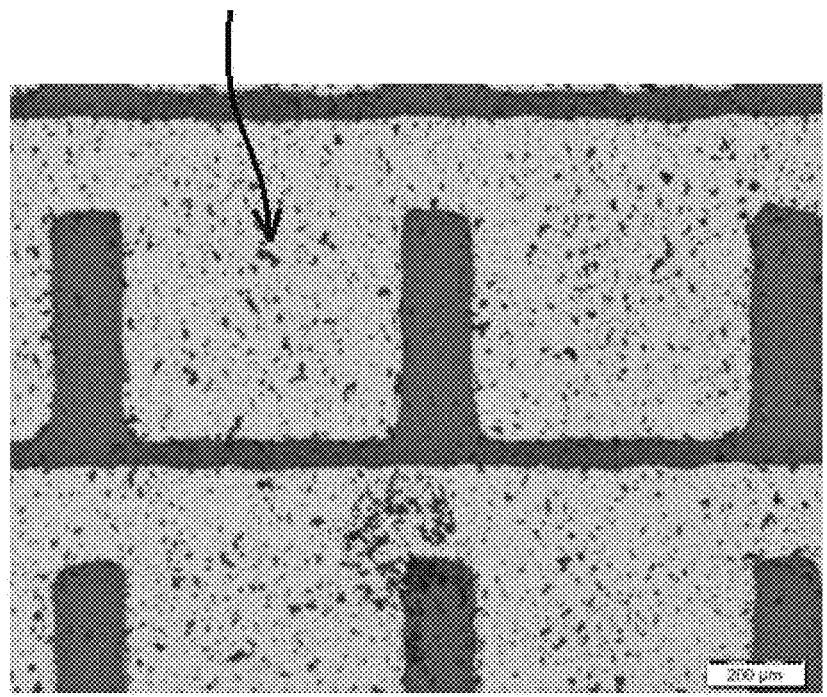

[Fig. 18]
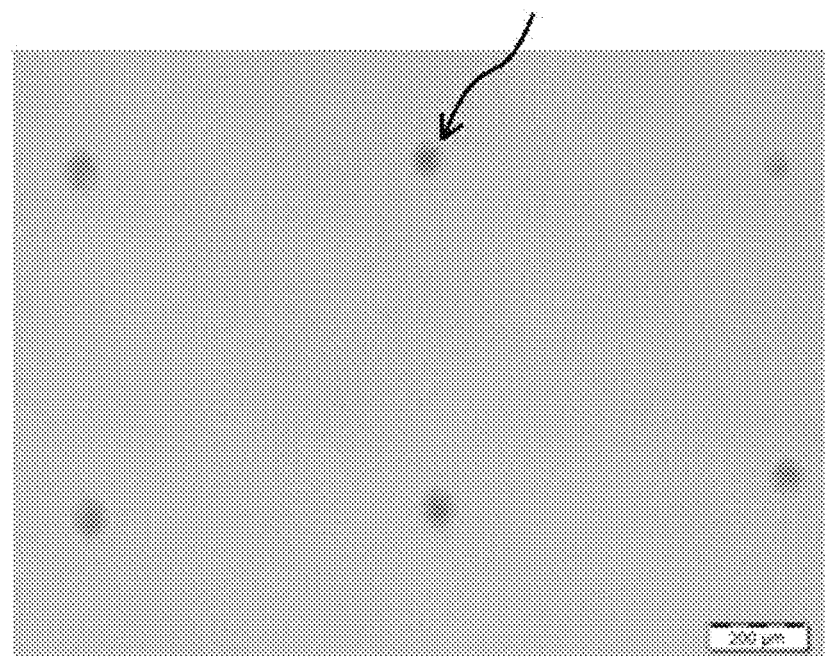

METHOD OF PRODUCING ETCHING MASK, ETCHING MASK PRECURSOR, AND OXIDE LAYER, AND METHOD OF MANUFACTURING THIN FILM TRANSISTOR

This application is divisional application of U.S. patent application Ser. No. 15/565,976, filed Oct. 12, 2017, which is a U.S. National Stage filing under 35 U.S.C. § 371 and 35 U.S.C § 119, based on and claiming priority to PCT/JP2016/057986, filed Mar. 14, 2016, and JP Patent Application No. 2015-084467, filed Apr. 16, 2015.

TECHNICAL FIELD

The present invention relates to a method of producing an etching mask, an etching mask precursor, and an oxide layer, and a method of producing a thin film transistor.

BACKGROUND ART

Conventionally, a polycrystalline silicon film or an amorphous silicon film has typically been adopted as a channel layer of a thin film transistor, which is an example of an electronic device. However, when a polycrystalline silicon film is used, electron scattering at the polycrystalline grain boundary limits electron mobility, so as to cause variation in transistor property. When an amorphous silicon film is used, electron mobility is very low and an element tends to deteriorate with time, so as to cause extremely low element reliability. In this regard, an oxide semiconductor has been attracting interests, which is higher in electron mobility than an amorphous silicon film and has less variation in transistor property than a polycrystalline silicon film. Moreover, not only an oxide semiconductor, but also an oxide conductive material or an oxide insulator made of an oxide is an essential technical element for realization of an electronic device made of only an oxide, for example, and thus is attracting very high industrial interests.

There has been recently an active attempt to produce an electronic device on a flexible resin substrate in accordance with a low-energy production process such as a printing method. There is an advantage that a semiconductor layer can be patterned directly on a substrate in accordance with a printing method or the like and no etching step is thus required for patterning.

For example, Patent Documents 1 to 3 represent attempts for producing a coated flexible electronic device including a conductive polymer or an organic semiconductor. Further, the present applicant discloses a technology for solving some of the aforementioned problems (Patent Document 4).

PRIOR ART DOCUMENTS

Patent Documents

Patent Document 1: JP Patent Publication (Kokai) No. 2007-134547A
Patent Document 2: JP Patent Publication (Kokai) No. 2007-165900A
Patent Document 3: JP Patent Publication (Kokai) No. 2007-201056A
Patent Document 4: WO2015/019771

SUMMARY OF THE INVENTION

Problems to be Solved by the Invention

While the industry and consumers demand various information terminals and information appliances, a semiconductor is required to operate at higher speed, to be stable for a long period of time, and to apply a less environmental load. However, the conventional technique typically includes a vacuum process, a process according to the photolithography technique, or the like, which requires a relatively long time period and/or expensive equipment. Therefore, these processes lead to very low utilization efficiency of raw materials and production energy. This is not preferred from the industrial and mass productivity perspectives. It is very difficult to form layers under current conditions by applying the above printing method, such as gravure printing, screen printing, offset printing, or ink jet printing to silicon semiconductors or other semiconductors that have been mainly used to date. Even in a case where any one of the conductive polymer and the organic semiconductor disclosed in Patent Documents 1 to 3 is adopted, the electrical property and stability thereof remain insufficient. In addition, the term "layer(s)" in this application conceptually includes a layer as well as a film. Similarly, the term "film" in this application conceptually includes a film as well as a layer.

Formation of layers by the above various printing methods, in particular by the screen printing method which is highly applicable to various devices such as semiconductor elements and electronic devices, is now attracting much attention in the industry in view of flexibilization of the devices including such layers, and in terms of industrialization and mass productivity mentioned above.

However, for example, the thickness of a layer formed in accordance with a printing method (in particular, by the screen printing method) differs from the thickness (typically in submicrons) of a layer (for example, an etching mask) required in manufacture of the aforementioned various devices such as semiconductor elements. Specifically, a relatively thick layer is formed upon patterning by a printing method, but the thickness required for an etching mask may significantly vary depending on the material or thickness of a film to be etched.

Meanwhile, a paste or a solution used in a printing method is supposed to have a viscosity suitable for patterning, and thus the viscosity thereof is adjusted with a polymer compound. The inventors of this application recognized that when an etching mask used for manufacturing various devices is formed with a paste or a solution containing aliphatic polycarbonate, for example, by the screen printing method, the stringiness of the aliphatic polycarbonate may not be appropriately controlled. This, therefore, may result in a problem in that a pattern of an etching mask which is good enough for use in the production processes of the aforementioned various devices, or suitable for manufacturing the aforementioned various devices may not be formed. As a more specific example, in a process of forming a layer of a precursor of an etching mask (hereinafter may also be referred to as an "etching mask precursor") by a printing method, a portion of the precursor may be fibrously withdrawn from the precursor layer which is formed on a layer to be etched and will form a pattern of the etching mask. This may disadvantageously disrupt the desired pattern.

Further, when a pattern of the aforementioned etching mask precursor is formed, for example, by a printing method, the pattern which has formed needs to be maintained at least until a material or region to be etched is removed. Therefore, formation of a pattern which is resistant to time-dependent change is also one of the challenges for, in particular, the printing method.

Meanwhile, the development of an etching mask for forming a pattern of a thin layer used for various devices such as semiconductor elements without impairing a function thereof is also another elemental technology for achieving the thin layer.

Solutions to the Problems

The inventors of this application have conducted extensive studies and analyses to develop various metal oxides which can be formed from liquid materials as well as an etching mask which can reliably provide a pattern of such a metal oxide and can also protect that metal oxide as much as possible without impairing a function thereof. More specifically, the inventors of this application conducted extensive studies and analyses to develop an elemental technology and various devices manufactured using the elemental technology, which can provide an etching mask capable of forming a pattern by a printing method (in particular, by the screen printing method), and in addition can reliably maintain or improve the functions of various layers, or can simplify a process of producing these layers using the etching mask.

In the studies and analyses conducted by the present inventors, a process in which a gel-like layer (hereinafter may also be referred to as a "gel layer") which can be obtained from the aforementioned paste or solution formed a pattern was investigated. As a result, the following finding was obtained: before aliphatic polycarbonate in a gel layer undergoes decomposition, i.e., before aliphatic polycarbonate is heated to a temperature at which the aliphatic polycarbonate is decomposed, the properties of the aliphatic polycarbonate itself or those of the paste or solution containing the aliphatic polycarbonate have some impacts on the height, printed conditions, or stringiness of a pattern of a gel layer when the pattern is formed, in particular, by the screen printing method. It is noted that in the present application, a gel layer suitable for screen printing is desired, and thus the present gel layer may also be referred to as a gel layer closer to the liquid state.

As a result of numerous trials and errors as well as numerous extensive analyses, the inventors of this application found that inclusion of aliphatic polycarbonate having a molecular weight in a specific range or having a specific stringiness can contribute to formation of a pattern having a desired thickness which can form an etching mask suitable for, in particular, the screen printing method. In addition, the inventors of this application found that the aforementioned desired pattern of a gel layer with a controllable thickness can be easily formed by a low-energy manufacturing process such as the screen printing method.

More interestingly, the inventors of this application found that a rectification behavior as an electrical property unique to semiconductors may be lost or impaired when an etching target is an oxide semiconductor, and a conventional resist mask is used as an etching mask for forming a pattern. The inventors of this application also found that in contrast, the rectification behavior of an oxide semiconductor which had been protected by an etching mask was able to be observed in a consistent manner when the aforementioned desired pattern of a gel layer with a controllable thickness was used as the etching mask. It is noted that the etching targets in the present invention include not only oxide semiconductors but also oxide conductive materials or oxide insulators, or other semiconductor materials, conductor materials, and insulator materials.

Therefore, in a more preferred aspect, an oxide (for example, a metal oxide) is used in combination of the aforementioned etching mask, the oxide being formed by annealing an oxide precursor as a starting material with which a pattern is difficult to be formed, for example, by the screen printing method to or above a temperature at which the oxide is formed, i.e., annealing it to or above a temperature at which an element dispersed in a solution containing aliphatic polycarbonate binds with oxygen. This is because a temperature at which the oxide is formed is higher than a temperature at which the etching mask is decomposed, and thus the etching mask has been already decomposed and removed reliably before the oxide is formed. As a result, at least the following effects of (1) and (2) can be provided.

(1) An effect of simplifying a production process where a step of removing the etching mask needs not be performed separately.

(2) An effect of maintaining or improving, in particular, the electrical properties of an oxide where effects on the physical properties of the oxide due to, for example, exposure to oxygen plasma or contact (typically immersion) with a chemical liquid for removing a resist mask can be reduced or eliminated.

That is, each of the above points of view and schemes can contribute to further improvement of the performance and manufacture technology of various devices such as semiconductor elements and electronic devices manufactured using an etching mask with a controllable thickness formed by a low-energy manufacturing process (in particular, by the screen printing method).

The present invention was made based on each of the above points of view and extensive analysis.

It is noted that the term "process from the liquid state to the gel state" as used herein typically refers to, for example, a state in which a solvent is removed to some extent (typically 80% or more by the mass ratio relative to the entire solvent) by heat treatment, but aliphatic polycarbonate is not substantially decomposed.

The etching mask for screen printing according to one embodiment of the present invention includes aliphatic polycarbonate.

The etching mask precursor for screen printing according to one embodiment of the present invention includes aliphatic polycarbonate.

With regard to the above etching mask precursor and etching mask, aliphatic polycarbonate can serve as a material of an etching mask which can be formed by the screen printing method. This per se is a very useful and striking effect. Further, the etching mask can be removed easily by heating at a decomposition temperature or above of aliphatic polycarbonate. Therefore, this can significantly contribute to simplifying processes of manufacturing various devices such as semiconductor elements and electronic devices.

It is noted that one preferred example of the above etching mask for screen printing is formed from an etching mask precursor including aliphatic polycarbonate in which the percentage of aliphatic polycarbonate having a molecular weight of 6000 or more and 400000 or less is 80% by mass or more relative to the entire aliphatic polycarbonate. Further, another preferred example of the above etching mask for screen printing is formed from an etching mask precursor including aliphatic polycarbonate having a value of L/(D× v×η) of 0.25 $mm^{-1}$ $Pa^{-1}$ or more wherein a cylindrical bar made of polytetrafluoroethylene and having a diameter "D" is dipped in a collection of aliphatic polycarbonate having a zero-shear viscosity η as measured using a rheometer (Model AR-2000EX, TA Instruments), and the length "L" of a strand withdrawn from the outermost surface of the collection of the aliphatic polycarbonate is then measured when the cylindrical bar is pulled upwardly at a velocity "v".

Further, one preferred example of the above etching mask precursor for screen printing includes aliphatic polycarbonate in which the percentage of aliphatic polycarbonate having a molecular weight of 6000 or more and 400000 or less is 80% by mass or more relative to the entire aliphatic polycarbonate. Further, another preferred example of the above etching mask precursor for screen printing includes aliphatic polycarbonate having a value of $L/(D \times v \times \eta)$ of 0.25 $mm^{-1}$ $Pa^{-1}$ or more wherein a cylindrical bar made of polytetrafluoroethylene and having a diameter "D" is dipped in a collection of aliphatic polycarbonate having a zero-shear viscosity $\eta$ as measured using a rheometer (Model AR-2000EX, TA Instruments), and the length "L" of a strand withdrawn from the outermost surface of the collection of the aliphatic polycarbonate is then measured when the cylindrical bar is pulled upwardly at a velocity "v".

When the aforementioned preferred examples of the etching mask for screen printing or the aforementioned preferred examples of the etching mask precursor for screen printing are used, the stringiness of aliphatic polycarbonate can be controlled more reliably in an appropriate manner. As a result, a good pattern of the etching mask precursor or the etching mask can be formed. It is noted that the studies and analyses conducted by the inventors of this application indicate that when aliphatic polycarbonate included in an etching mask precursor and an etching mask satisfies a numerical range based on the aforementioned computational expression, the stringiness of the aliphatic polycarbonate can appropriately be controlled for a layer formed, for example, by the screen printing method. Therefore, a good pattern of the etching mask precursor or the etching mask can be formed when the above numerical range is satisfied.

Further, a method of producing an oxide layer according to one embodiment of the present invention includes an etching-mask forming step of forming a pattern of an etching mask on an oxide layer by the screen printing method, the etching mask including aliphatic polycarbonate; a contact step of, after the etching-mask forming step, contacting the oxide layer with a solution for dissolving a portion the oxide layer not protected by the etching mask; and a heating step of, after the contact step, heating the oxide layer and the etching mask to or above a temperature at which the etching mask is decomposed.

Further, a method of producing an oxide layer according to another embodiment of the present invention includes an etching-mask forming step of forming a pattern of an etching mask including aliphatic polycarbonate on an oxide precursor layer to be oxidized into the oxide layer by the screen printing method; a contact step of, after the etching-mask forming step, contacting the oxide precursor layer with a solution for dissolving a portion of the oxide precursor layer not protected by the etching mask; and a heating step of, after the contact step, heating the oxide precursor layer and the etching mask to or above a temperature at which the oxide layer is formed.

Further, a method of producing an oxide layer according to another embodiment of the present invention includes an etching-mask forming step of forming a pattern of an etching mask including aliphatic polycarbonate on an oxide layer by the screen printing method; an exposure step of, after the etching-mask forming step, exposing the oxide layer to a plasma for etching a portion of the oxide layer not protected by the etching mask; and a heating step of, after the exposure step, heating the oxide layer and the etching mask to or above a temperature at which the etching mask is decomposed.

Further, a method of producing an oxide layer according to another embodiment of the present invention includes an etching-mask forming step of forming a pattern of an etching mask including aliphatic polycarbonate on an oxide precursor layer to be oxidized into the oxide layer by the screen printing method; an exposure step of, after the etching-mask forming step, exposing the oxide precursor layer to a plasma for etching a portion of the oxide precursor layer not protected by the etching mask; and a heating step of, after the exposure step, heating the oxide precursor layer and the etching mask to or above a temperature at which the oxide layer is formed.

In each of the aforementioned methods of producing an oxide layer, when the oxide layer in a region to be etched is etched using an etching mask, the etching mask after formation of a pattern of the oxide layer can be removed by the heating step as a relatively easy treatment regardless of whether the so-called contact step with a solution (typically an immersion step) or the exposure step with plasma is used. Further, the etching mask used in each of the aforementioned production methods can be decomposed and removed reliably by virtue of aliphatic polycarbonate included therein. In particular, when the target of etching is an oxide precursor layer to be oxidized into an oxide layer, the etching mask is also decomposed and removed during the heating step of heating the oxide precursor layer to or above a temperature at which the oxide layer is formed. As a result, this can provide a unique process-simplifying effect in which a step of removing the etching mask needs not be performed separately.

Further, a method of manufacturing a thin film transistor according to another embodiment of the present invention includes an oxide-layer forming step of forming an oxide layer so that the oxide layer is brought into contact with a gate electrode through a gate insulator, the oxide layer being formed via the heating step of any one of the aforementioned methods of producing an oxide layer and being protected by the etching mask.

According to the method of manufacturing a thin film transistor described above, the rectification behavior of the oxide layer can be reliably maintained.

The term "metal oxide" in this application conceptually includes an oxide semiconductor, an oxide conductive material, or an oxide insulator. In addition, an oxide semiconductor, an oxide conductive material, and an oxide insulator are relative concepts in view of electroconductivity and thus require no strict distinction. If metal oxides are supposed to be of the same type, they can be recognized by a person skilled in the art as oxide semiconductors or as oxide conductive materials or oxide insulators, depending on various device requirements. The term "substrate" in this application is not limited to a base in a plate shape but includes a base and a base material in different modes. Furthermore, the term "application" in each of the embodiments to be described later in this application indicates forming a layer on a substrate in accordance with a low-energy production process such as typically a printing method. Further, the term "metal" in this application encompasses not only typical elemental metals but also transition metals.

Effects of the Invention

The etching mask for screen printing according to one embodiment of the present invention and the etching mask precursor for screen printing according to one embodiment of the present invention can sufficiently function as an etching mask. In addition, the etching mask can be easily removed by heating to a decomposition temperature or above of aliphatic polycarbonate. Therefore, this can significantly contribute to simplifying processes of manufacturing various devices such as semiconductor elements and electronic devices.

Further, in the methods of producing an oxide layer according to one embodiment of the present invention, when a region to be etched of the oxide layer is etched using an etching mask, the etching mask after formation of a pattern of the oxide layer can be removed by the heating step as a relatively easy treatment regardless of whether the so-called contact step with a solution (typically an immersion step) or the exposure step with plasma is used.

BRIEF DESCRIPTION OF THE DRAWINGS

FIG. 1 shows typical examples of optical photomicrographs of good patterns realized according to a first embodiment of the present invention.

FIG. 2A shows typical examples of optical photomicrographs of unfavorable patterns formed according to the first embodiment of the present invention.

FIG. 2B shows typical examples of optical photomicrographs of good patterns formed according to the first embodiment of the present invention.

FIG. 3A is a graph showing the relationship between each sample and evaluation parameters indicating stringiness according to the first embodiment of the present invention.

FIG. 3B is a graph showing the relationship between each sample and evaluation parameters indicating stringiness according to the first embodiment of the present invention.

FIG. 4A is a graph showing the contact angle between a base material and a solution and the expansion ratio of the solution on the base material with respect to changes in the concentration of 2-nitropropane at 30 seconds after the placement of the solution containing aliphatic polycarbonate on the base material according to the first embodiment of the present invention.

FIG. 4B is a graph showing the contact angle between a base material and a solution and the expansion ratio of the solution on the base material with respect to changes in the concentration of 2-nitropropane at 120 seconds after the placement of the solution containing aliphatic polycarbonate on the base material according to the first embodiment of the present invention.

FIG. 5 is a schematic sectional view showing a process in a method of producing a thin film transistor according to a second embodiment of the present invention.

FIG. 6 is a schematic sectional view showing a process in a method of producing a thin film transistor according to the second embodiment of the present invention.

FIG. 7 is a schematic sectional view showing a process in a method of producing a thin film transistor according to the second embodiment of the present invention.

FIG. 8 is a schematic sectional view showing a process in a method of producing a thin film transistor according to the second embodiment of the present invention.

FIG. 9A is a schematic sectional view showing a process in a method of producing a thin film transistor according to the second embodiment of the present invention.

FIG. 9B is a schematic sectional view showing a process in a method of producing a thin film transistor according to the second embodiment of the present invention.

FIG. 9C shows an image (a plan view photograph) representing a process described with reference to FIG. 9B according to the present invention.

FIG. 9D is a schematic sectional view showing a process in the method of producing a thin film transistor according to the second embodiment of the present invention.

FIG. 9E is an image (a plan view photograph) representing a process described with reference to in FIG. 9D according to the present invention.

FIG. 10A is a schematic sectional view showing a process in the method of producing a thin film transistor according to the second embodiment of the present invention.

FIG. 10B is an image (a plan view photograph) representing a process described with reference to FIG. 10A according to the present invention.

FIG. 11 is a graph showing the TG-DTA properties of an indium and zinc-containing solution as an example of a material of an oxide semiconductor precursor for forming a channel of the thin film transistor according to the second embodiment of the present invention.

FIG. 12 is a graph showing the TG-DTA properties of a solution of polypropylene carbonate as an example of a solution containing only aliphatic polycarbonate as a solute for forming a component of the thin film transistor according to the second embodiment of the present invention (a typical example of an etching mask precursor).

FIG. 13 is a graph showing the rectification behavior of a channel constituting a part of the thin film transistor according to the second embodiment of the present invention.

FIG. 14 is a schematic sectional view showing a process in the method of producing a thin film transistor according to the second embodiment of the present invention.

FIG. 15 is a schematic sectional view showing a process in the method of producing a thin film transistor according to the second embodiment of the present invention.

FIG. 16A is a schematic sectional view showing a process in the method of producing a thin film transistor according to the modification example (1) of the second embodiment of the present invention.

FIG. 16B is a schematic sectional view showing a process in the method of producing a thin film transistor according to the modification example (1) of the second embodiment of the present invention.

FIG. 17A is a plan view photograph showing the result from etching treatment of a chromium (Cr) layer using the etching mask according to the first embodiment in the alternative embodiments (1) of the present invention.

FIG. 17B is a plan view photograph showing the result from etching treatment of a chromium (Cr) layer using an etching mask (a known resist mask) as Comparative Example of FIG. 17A.

FIG. 18 is a plan view photograph showing the result from etching treatment of a silicon dioxide ($SiO_2$) layer using the etching mask according to the first embodiment in the alternative embodiments (2) of the present invention.

DESCRIPTION OF REFERENCE SIGNS

10 Substrate
24 Gate electrode
32 Gate insulator precursor layer
34 Gate insulator
42 Channel precursor layer
44 Channel
50 ITO layer
56 Drain electrode 58 Source electrode
80 Etching mask
100 Thin film transistor

EMBODIMENTS OF THE INVENTION

An etching mask precursor, an etching mask, an oxide precursor, an oxide layer, a semiconductor element, and an electronic device according to embodiments of the present invention, and a method of producing these will be described in detail with reference to the accompanying drawings. It is noted that in this disclosure, common parts are denoted by the same reference numbers throughout the drawings unless otherwise stated. Further, components in the drawings used in the present embodiments are not necessarily illustrated in accordance with relative scaling. Moreover, some of the reference numbers may be omitted for clarity of the drawings.

First Embodiment

1. Etching Mask Precursor, Configurations of Etching Mask, and Method of Producing these The "etching mask precursor" according to this embodiment is in a state where aliphatic polycarbonate (which may include inevitable impurities. The same shall apply hereafter) is dissolved in a certain solvent (typically an organic solvent). Further, the "etching mask" according to this embodiment is in a state (typically a "gel state") where the solvent has been removed by heating the etching mask precursor thereof to an extent where it can be used for screen printing.

The etching mask precursor or etching mask according to this embodiment mainly includes aliphatic polycarbonate, but may include a compound, composition, or material other than aliphatic polycarbonate. It is noted that there is no particular limitation for the lower limit of the content of aliphatic polycarbonate in the etching mask precursor or etching mask, but the mass percentage of aliphatic polycarbonate to the total amount of a solute is typically 80% or more. Further, there is no particular limitation for the upper limit of the content of aliphatic polycarbonate in the etching mask precursor or etching mask, but the mass percentage of aliphatic polycarbonate to the total amount of a solute is typically 100% or less. In addition, after the target of etching is subjected to etching treatment using a pattern formed, for example, by the screen printing method, aliphatic polycarbonate is to be decomposed and/or removed primarily in a heating step.

With regard to the etching mask precursor and etching mask according to this embodiment, aliphatic polycarbonate can serve as a material of an etching mask which can be formed by the screen printing method. This per se is a very useful and striking effect. As described above, the etching mask can be removed very easily by heating at a decomposition temperature or above of aliphatic polycarbonate. This can significantly contribute to simplifying processes for manufacturing various devices such as semiconductor elements and electronic devices. Further, in order to reliably remove the etching mask by heating at a decomposition temperature or above of aliphatic polycarbonate, no other compounds, compositions, or materials having a decomposition temperature higher than that of aliphatic polycarbonate are preferably included in the etching mask precursor solution or in the etching mask.

In this embodiment, the percentage of aliphatic polycarbonate having a molecular weight of 6000 or more and 400000 or less in the etching mask precursor or the etching mask is 80% by mass or more relative to the entire aliphatic polycarbonate.

(Aliphatic Polycarbonate and Solution Containing the Aliphatic Polycarbonate)

Next, with regard to aliphatic polycarbonate used in this embodiment, aliphatic polycarbonate and a solution containing the aliphatic polycarbonate (that is, the "etching mask precursor") will be described in detail.

In this embodiment, endothermically decomposable aliphatic polycarbonate having good pyrolysability is used. It is noted that whether the thermal decomposition reaction of aliphatic polycarbonate is an endothermic reaction or not can be determined by the differential thermal analysis (DTA). Such aliphatic polycarbonate has a high oxygen content, and can be decomposed into low-molecular weight compounds at a relatively low temperature, and thus actively contributes to reduction of the amount of residual impurities in a metal oxide such as carbonous impurities.

Further, in this embodiment, there is no particular limitation for the organic solvent which can be used for the "etching mask precursor" as a solution containing aliphatic polycarbonate, as long as it is an organic solvent in which aliphatic polycarbonate can be dissolved. Specific examples of the organic solvent include diethylene-glycol-monoethyl ether acetate (hereinafter, may also be referred to as "DEGMEA"), α-terpineol, β-terpineol, N-methyl-2-pyrrolidone, 2-nitropropane, isopropyl alcohol, diethylene-glycol-monobutyl ether acetate, diethylene glycol monobutyl ether, toluene, cyclohexane, methyl ethyl ketone, dimethyl carbonate, diethyl carbonate, propylene carbonate, and the like. Among these organic solvents, preferably used are diethylene-glycol-monoethyl ether acetate, α-terpineol, N-methyl-2-pyrrolidone, 2-nitropropane, and propylene carbonate in view of their suitably high boiling points and low vaporizability at room temperature. It is noted that in this embodiment, the organic solvent will be eventually removed as an unwanted substance after etching the target of etching using an etching mask including aliphatic polycarbonate. Therefore, a solvent mixture of DEGMEA and 2-nitropropane is preferably used because a pattern is only required to persist for a relatively short time from pattern formulation to decomposition or removal.

Further, a dispersing agent, a plasticizing agent, and the like can further be added, if desired, to the etching mask precursor as a solution containing aliphatic polycarbonate.

Specific examples of the dispersing agent include:
polyhydric alcohol esters such as glycerin and sorbitan;
polyether polyols such as diethylene glycol, triethylene glycol, dipropylene glycol, tripropylene glycol, polyethylene glycol, and polypropylene glycol; amines such as polyethyleneimine;
(meth)acrylic resins such as polyacrylic acid and polymethacrylic acid;
copolymers of isobutylene or styrene with maleic anhydride, and amine salts thereof; and the like.

Specific examples of the plasticizing agent include polyether polyol, phthalate ester, and the like.

Further, there is no particular limitation for the method of forming an etching mask precursor layer according to this embodiment. In one preferred aspect, a layer is formed by a low-energy manufacturing process. More specifically, an etching mask precursor layer is preferably formed by application to a base material in accordance with screen printing as a particularly simple method.

(Aliphatic Polycarbonate)

In each experimental example as described later, polypropylene carbonate is adopted as an example of aliphatic polycarbonate, but examples of the aliphatic polycarbonate adopted in this embodiment are not particularly limited. For example, according to a preferably adoptable aspect of this embodiment, aliphatic polycarbonate obtained by polymerization reaction between epoxide and carbon dioxide is used. Adoption of such aliphatic polycarbonate obtained by polymerization reaction between epoxide and carbon dioxide exerts an effect such that aliphatic polycarbonate having a desired molecular weight can be obtained, by which endothermic decomposition properties can be improved through the control of the structure of the aliphatic polycarbonate. The aliphatic polycarbonate is preferably at least one member selected from the group consisting of a polyethylene carbonate and a polypropylene carbonate in terms of a high oxygen content and decomposition into a low molecular weight compound at a relatively low temperature. With the use of any aliphatic polycarbonate described above having a molecular weight within the above numeric range, effects similar to those of this embodiment can be exerted.

The epoxide is not particularly limited if the epoxide undergoes a polymerization reaction with carbon dioxide to form aliphatic polycarbonate having a structure including aliphatic groups on the main chain. Adoptable examples of the epoxide in this embodiment include ethylene oxide, propylene oxide, 1-butene oxide, 2-butene oxide, isobutylene oxide, 1-pentene oxide, 2-pentene oxide, 1-hexene oxide, 1-octene oxide, 1-decene oxide, cyclopentene oxide, cyclohexene oxide, styrene oxide, vinylcyclohexene oxide, 3-phenylpropylene oxide, 3,3,3-trifluoropropylene oxide, 3-naphthylpropylene oxide, 3-phenoxypropylene oxide, 3-naphthoxypropylene oxide, butadiene monoxide, 3-vinyloxypropylene oxide, and 3-trimethylsilyloxypropylene oxide. Among these epoxides, ethylene oxide and propylene oxide are preferably used in terms of their high polymerization reactivity with carbon dioxide. These epoxides may each be used singly or may be used in combination of two or more thereof.

The aliphatic polycarbonate mentioned above has a mass-average molecular weight of preferably from 5000 to 1000000 and more preferably from 10000 to 500000. The aliphatic polycarbonate having a mass-average molecular weight of less than 5000 may become unsuitable as a material for the screen printing method because of influences due to a decrease in viscosity, for example. The aliphatic polycarbonate having a mass-average molecular weight of more than 1000000 may also become unsuitable as a material for the screen printing method due to lower dissolubility of the aliphatic polycarbonate into an organic solvent. In addition, the numerical values of the mass-average molecular weight can be calculated by the following method.

Specifically, a chloroform solution containing the aliphatic polycarbonate at a concentration of 0.5% by mass is prepared and measured using high performance liquid chromatography. After the measurement, the molecular weight is calculated by comparison with polystyrene having a known mass-average molecular weight measured under the identical conditions. The measurement conditions are as follows.

Type: HLC-8020 (Tosoh Corporation)
Column: GPC column (Trade name: TSK GEL Multipore HXL-M, Tosoh Corporation)
Column temperature: 40° C.
Eluent: chloroform
Flow speed: 1 mL/minute The aliphatic polycarbonate mentioned above can be exemplarily produced by polymerization reaction between the epoxide and carbon dioxide in the presence of a metal catalyst.

A production example of aliphatic polycarbonate is as follows.

The atmosphere of the system of an autoclave having a volume of 1 L and equipped with a stirrer, a gas introduction tube, and a thermometer was preliminarily replaced with an atmosphere of nitrogen, and was then charged with a reaction solution containing an organozinc catalyst, hexane, and propylene oxide. The atmosphere of the reaction system was then replaced with an atmosphere of carbon dioxide by adding carbon dioxide with stirring, and the autoclave was filled with carbon dioxide until the pressure of the reaction system reached about 1.5 MPa. The temperature of the autoclave was subsequently raised to 60° C. and polymerization reaction was carried out for several hours while supplying carbon dioxide to be consumed by the reaction. After completion of the reaction, the autoclave was cooled and depressurized and its content was filtrated. The filtrated product was then dried under reduced pressure to obtain polypropylene carbonate.

Specific examples of the metal catalyst include an aluminum catalyst and a zinc catalyst. Among these metal catalysts, the zinc catalyst is preferably used in terms of high polymerization activity in polymerization reaction between epoxide and carbon dioxide. An organozinc catalyst is particularly preferred among the zinc catalysts.

Specific examples of the organozinc catalyst include:
organozinc catalysts such as zinc acetate, diethyl zinc, and dibutyl zinc; and
organozinc catalysts obtained by reaction between a zinc compound and compounds such as primary amine, dihydric phenol, divalent aromatic carboxylic acid, aromatic hydroxy acid, aliphatic dicarboxylic acid, and aliphatic monocarboxylic acid.

According to a preferred aspect, an organozinc catalyst among these organozinc catalysts is adopted, which is obtained by reaction of a zinc compound with an aliphatic dicarboxylic acid and an aliphatic monocarboxylic acid, due to higher polymerization activity.

A production example of an organozinc catalyst is as follows.

A four-necked flask equipped with a stirrer, a nitrogen gas introduction tube, a thermometer, and a reflux condenser was charged with zinc oxide, glutaric acid, acetic acid, and toluene. After the atmosphere of the reaction system was replaced with an atmosphere of nitrogen, the temperature of the flask was raised to 55° C. and the materials were stirred at this temperature for 4 hours so as to perform reaction of the respective materials. The temperature of the flask was then raised to 110° C. and the materials were stirred at this temperature for 4 hours so as to cause azeotropic dehydration for removal of only water. The flask was then cooled to room temperature to obtain a reaction solution containing an organozinc catalyst. The organozinc catalyst, which was obtained by partially fractionating and filtrating the reaction solution, was subjected to IR measurement (Thermo Nicolet Japan Inc., trade name: AVATAR360). As a result, no peak based on carboxylic groups was confirmed.

The amount of the metal catalyst used for the polymerization reaction is preferably 0.001 to 20 parts by mass and more preferably 0.01 to 10 parts by mass with respect to 100 parts by mass of the epoxide. The polymerization reaction may be unlikely to progress if the amount of the used metal catalyst is less than 0.001 parts by mass. In contrast, if the amount of the used metal catalyst exceeds 20 parts by mass, effects in accord with the amount of use may not be obtained, which may be economically undesirable.

A reaction solvent to be used as necessary in the polymerization reaction is not particularly limited. Any type of an organic solvent can be adopted as the reaction solvent. Specific examples of the organic solvent include:

aliphatic hydrocarbon solvents such as pentane, hexane, octane, decane, and cyclohexane;

aromatic hydrocarbon solvents such as benzene, toluene, and xylene;

halogenated hydrocarbon solvents such as chloromethane, methylene dichloride, chloroform, carbon tetrachloride, 1,1-dichloroethane, 1,2-dichloroethane, ethyl chloride, trichloroethane, 1-chloropropane, 2-chloropropane, 1-chlorobutane, 2-chlorobutane, 1-chloro-2-methylpropane, chlorobenzene, and bromobenzene; and carbonate solvents such as dimethyl carbonate, diethyl carbonate, and propylene carbonate.

The amount of the used reaction solvent is preferably 500 parts by mass or more and 10000 parts by mass or less with respect to 100 parts by mass of the epoxide in terms of smooth reaction.

The method of the reaction between an epoxide and carbon dioxide in the presence of a metal catalyst is not particularly limited in the polymerization reaction described above. For example, an adoptable method includes charging in an autoclave the epoxide, the metal catalyst, and a reaction solvent as necessary, mixing these components, and then injecting carbon dioxide under pressure for reaction.

The pressure under which the carbon dioxide is used in the polymerization step is not particularly limited. Typically, the pressure is preferably from 0.1 MPa to 20 MPa, more preferably from 0.1 MPa to 10 MPa, and even more preferably from 0.1 MPa to 5 MPa. If the carbon dioxide is used at a pressure exceeding 20 MPa, effects in accord with the amount of use may not be obtained, which may be economically undesirable.

The polymerization reaction temperature in the above polymerization reaction is not particularly limited. The typical polymerization reaction temperature is preferably from 30° C. to 100° C. and more preferably from 40° C. to 80° C. If the polymerization reaction temperature is lower than 30° C., the polymerization reaction may take a long period. In contrast, if the polymerization reaction temperature exceeds 100° C., side reaction may occur with a lower yield. The period of the polymerization reaction is typically preferred to be from 2 to 40 hours, although the period differs depending on the polymerization reaction temperature and cannot be determined generally.

After the completion of the polymerization reaction, the aliphatic polycarbonate may be obtained by filtration or the like, and washing with a solvent or the like as necessary, followed by drying.

[Correlation Between Molecular Weight of Aliphatic Polycarbonate and Stringiness and Shape of Pattern]

The inventors of this application extensively studied and analyzed the correlation between the molecular weight of aliphatic polycarbonate and the stringiness and the shape of a pattern typically by conducting the following experiments. As a result, the inventors of this application found that the stringiness of an etching mask in the "gel state" can be controlled, and a good pattern can be formed when the percentage of aliphatic polycarbonate having a molecular weight of 6000 or more and 400000 or less as a representative example of the molecular weight of aliphatic polycarbonate is 80% by mass or more relative to the entire aliphatic polycarbonate. It is noted that a type of aliphatic polycarbonate used in the following Experimental Examples is polypropylene carbonate (hereinafter may also be referred to as "PPC").

Experimental Example 1

As examples of aliphatic polycarbonate, samples of the etching mask precursors in which at least one of 4 types of PPCs having different mass-average molecular weights was dissolved were prepared as shown in the following (1) to (10). It is noted that each of the following mass-average molecular weights represents values for aliphatic polycarbonate only.

(1) Only a PPC having mass-average molecular weight of 30000 (hereinafter may also be referred to as "Sample A")

(2) Only a PPC having mass-average molecular weight of 90000 (hereinafter may also be referred to as "Sample B")

(3) A 1:1 mixture of Sample A and Sample B (hereinafter may also be referred to as "Sample AB")

(4) Only a PPC having mass-average molecular weight of 230000 (hereinafter may also be referred to as "Sample C")

(5) Only a PPC having mass-average molecular weight of 590000 (hereinafter may also be referred to as "Sample D")

(6) A 1:1 mixture of Sample C and Sample D (hereinafter may also be referred to as "Sample CD")

(7) A 1:1 mixture of Sample A and Sample C (hereinafter may also be referred to as "Sample AC")

(8) A 1:1 mixture of Sample B and Sample C (hereinafter may also be referred to as "Sample BC")

(9) A 1:1 mixture of Sample A and Sample D (hereinafter may also be referred to as "Sample AD")

(10) A 1:1 mixture of Sample B and Sample D (hereinafter may also be referred to as "Sample BD")

For the above samples, the percentage of aliphatic polycarbonate having a molecular weight of 6000 or more and 400000 or less was determined as follows. That is, a solution of 0.5% by mass of aliphatic polycarbonate prepared in chloroform was subjected to high performance liquid chromatography under the following conditions, and compared with a polystyrene having a known molecular weight to determine the molecular weight distribution.

Model: HLC-8020 (Tosoh Corporation)
Column: GPC column (Trade name: TSK GEL Multipore HXL-M, Tosoh Corporation)
Column temperature: 40° C.
Eluent: chloroform
Flow rate: 1 mL/minute The ratio of the area corresponding to the region of the molecular weight of 6000 or more and 400000 or less to the area corresponding to the entire chromatogram region was calculated from a chromatogram obtained by the above method wherein the horizontal axis represents a molecular weight (log of molecular weight) and the vertical axis represents an elution rate (dwt/d (log of molecular weight)). The results obtained are shown in Table 1.

TABLE 1

| Sample | Percentage (% by mass) of aliphatic polycarbonate having a molecular weight of 6000 to 400000 |
|---|---|
| (1) | 81 |
| (2) | 93 |
| (3) | 87 |
| (4) | 79 |

TABLE 1-continued

| Sample | Percentage (% by mass) of aliphatic polycarbonate having a molecular weight of 6000 to 400000 |
|---|---|
| (5) | 58 |
| (6) | 69 |
| (7) | 80 |
| (8) | 86 |
| (9) | 70 |
| (10) | 76 |

Next, the etching mask precursor was subjected to a heating and stirring step at about 50° C. for about 72 hours under an atmosphere of air, and then subjected to a defoaming step for about 30 minutes to form an etching mask precursor in the "gel state" (or a gel state closer to a liquid form) having a viscosity suitable for the screen printing method. Subsequently, rectangular patterns of the above etching mask were formed on a glass substrate "Eagle XG" (200×150×0.7 tmm$^3$) by the screen printing method.

Further, preliminary annealing of the patterns was then performed at 150° C. for 30 minutes in an atmosphere of air, and then the patterns were evaluated for stringiness under an optical microscope and an atomic force microscope (AFM).

The summary of the above experimental results is shown in Table 2.

TABLE 2

| Sample | Shape of pattern | Stringiness | Height of pattern (μm) |
|---|---|---|---|
| (1) | Good | Good | 1.4 |
| (2) | Good | Good | 1.5 |
| (3) | Good | Good | 1.8 |
| (4) | Good | Bad | 2.6 |
| (5) | Bad | Bad | 4 |
| (6) | Bad | Bad | Unmeasurable |
| (7) | Good | Good | 2.1 |
| (8) | Good | Good | 2.1 |
| (9) | Bad | Bad | 5.3 |
| (10) | Bad | Bad | 5.3 |

The "shape of pattern" in Table 2 represents the fidelity of the patterns formed by the printing method. Accordingly, the expression "bad" with regard to "shape of pattern" means a situation in which a pattern of the etching mask is not formed to an extent where it can be used for device production. On the other hand, the expression "good" with regard to "shape of pattern" means a situation in which a pattern of the etching mask is reproduced to an extent where it can be used for device production. Moreover, the expression "bad" with regard to "stringiness" in Table 2 means a state in which a portion of the etching mask layer with which a pattern has been formed by the printing method is drawn as a strand from the etching mask layer, and the desired pattern is disturbed. Furthermore, the expression "good" with regard to "stringiness" means a state in which almost no or completely no stringiness is observed. In addition, "height of pattern" in Table 2 indicates the highest height of a pattern as measured under an atomic force microscope (AFM). Furthermore, the expression "unmeasurable" with regard to "height of pattern" for Sample (6) means a situation in which a pattern itself was not essentially formed.

In addition to Table 2 above, the results of the above (1), (7), and (8) are shown in FIG. 1, as examples of typical optical photomicrographs showing the realization of good patterns. The results of the above (5), (9), and (10) are shown in FIG. 2A as examples of typical optical photomicrographs showing unfavorable patterns formed as a result of uncontrolled stringiness.

As depicted in Table 2, FIG. 1, and FIG. 2A, relatively low-molecular-weight aliphatic polycarbonate, (1) "Sample A", (2) "Sample B", and (3) "Sample AB", and moderate-molecular-weight aliphatic polycarbonate, (7) "Sample AC" were found to have good "shape of pattern" and "stringiness". In particular, Sample C ((4) in Table) is indicated to have "bad" stringiness in Table 2, however, stringiness was observed only partially on the pattern.

The thus obtained results indicate that "shape of patterning" or "stringiness" becomes worse due to an increase in molecular weight. Meanwhile, for example, a pattern formed by a screen printing method preferably has a "height" at a level or higher. It was also found that the adoption of aliphatic polycarbonate having a significantly low molecular weight is not preferred in order to achieve "height of pattern" at a level or higher while maintaining good "shape of pattern" and "stringiness".

In addition, the inventors of this application consider the cause of "bad" "shape of patterning" and "bad" "stringiness" of (9) "Sample AD" and (10) "Sample BD" as follows.

As depicted in "height of pattern" in Table 2, each height of pattern (5.3 μm) of (9) "Sample AD" and (10) "Sample BD" is almost the same as the sum of the height of pattern (1.4 μm) of "Sample A" and the height of pattern (4 μm) of "Sample D", or, the sum of the height of pattern (1.5 μm) of "Sample A" and the height of pattern (4 μm) of "Sample D". Accordingly, it is considered that the use of a sample prepared by dissolving only one type of PPC as a binder results in a situation where high-molecular-weight aliphatic polycarbonate and low-molecular-weight aliphatic polycarbonate become immiscible due to namely, phase separation, when a difference in molecular weight between the two exceeds a level. More specifically, there can be a situation where high-molecular-weight aliphatic polycarbonate is placed on low-molecular-weight aliphatic polycarbonate, or a situation opposite to that. Meanwhile, (7) "Sample AC" or (8) "Sample BC" having relatively a small difference in molecular weight were considered to be in a state in which the high-molecular-weight aliphatic polycarbonate and the low-molecular-weight aliphatic polycarbonate are mixed appropriately without undergoing namely, phase separation. This is considered to be the reason of their good "shape of patterning" and "stringiness".

Therefore, the above experimental results can be said to indicate that even when materials of the same kind were used, specifically, when multiple types of aliphatic polycarbonate having different mass-average molecular weights were used, simple equalization of the mass-average molecular weights of the multiple types of aliphatic polycarbonate cannot always lead to a molecular weight appropriate for obtaining good "shape of patterning" and "stringiness".

Each of the above results and the results of examination and analyses made by the inventors of this application concerning other molecular weights together indicate that good "shape of pattern" and "stringiness" can be realized by adopting aliphatic polycarbonate having a molecular weight of 6000 or more and 400000 or less and constituting 80% by mass or more of the entire aliphatic polycarbonate.

Furthermore, the results from (1) to (10) revealed that the data from the samples of the oxide semiconductor precursors in which one of the 4 types of PPCs having different mass-average molecular weights was dissolved as a binder, or the samples of the oxide semiconductor precursors in which two of the PPCs as binders were dissolved in combination showed a similar trend. It is noted that each of the samples of the oxide semiconductor precursors contains 5% by mass of a solution containing 0.2 mol/kg of indium. Moreover, the sample numbers used in Table 3 are the same as those used in Table 1 for clarifying the correspondence relationship with (1) to (10) in Table 1.

Production examples of oxide precursors are as follows. It is noted that in each of the following experimental examples, an oxide semiconductor precursor, i.e., a precursor to be oxidized into an oxide semiconductor is used as a representative example.

First, indium acetylacetonate and propionic acid were gradually mixed in a 50 mL flask with stirring to obtain an indium-containing solution which will eventually form indium oxide.

Next, polypropylene carbonate was dissolved in a solvent mixture of DEGMEA and 2-nitropropane in a 50 mL egg-plant-shaped flask to obtain a solution of 25 wt % polypropylene carbonate.

Subsequently, the above indium-containing solution was gradually added to the above solution of polypropylene carbonate to obtain the above oxide semiconductor precursor.

Experimental results shown in Table 3 will be described. (1) "Sample A", (2) "Sample B", and (3) "Sample AB" as aliphatic polycarbonate having a relatively low molecular weight, and (7) "Sample AC" as aliphatic polycarbonate having a medium molecular weight were found to show good "shape of pattern" and "stringiness". Interestingly, Samples (9) and (10) having a relatively large molecular weight were also found to show good pattern shapes and stringiness. FIG. 2B represents an image taken under an optical microscope showing the results from (9) and (10) in which good patterns were formed as a result of successful control of stringiness. The good pattern shapes and stringiness for the samples (9) and (10) can likely be explained in part by a somewhat decreased overall concentration of PPC due to addition of the indium-containing solution to the samples used in Table 2. However, this does not appear to be the predominant factor.

TABLE 3

| Sample | Shape of pattern | Stringiness | Height of pattern (μm) |
|---|---|---|---|
| (1) | Bad | Good | 1 |
| (2) | Bad | Good | Unmeasurable |
| (3) | Good | Good | 1.2 |
| (4) | Bad | Bad | 4.4 |
| (5) | Bad | Bad | Unmeasurable |
| (6) | Bad | Bad | Unmeasurable |
| (7) | Good | Good | 3.2 |
| (8) | Good | Good | 2.6 |
| (9) | Good | Good | 3.7 |
| (10) | Good | Good | 5.3 |

Experimental Example 2

Next, in the following experiment, the inventors of this application measured the average length of drawn out strands (mm) and zero-shear viscosity (Pa·s) of the samples (1) to (10) used in experimental example 1.

In this experiment, first, regarding the average length of drawn-out strands (mm), a cylindrical bar made of polytetrafluoroethylene and having a diameter "D" of 2.9 mm was dipped in a collection of aliphatic polycarbonate, which had been formed using each sample, within a container. When the cylindrical bar was then raised at a velocity "v" of 5 mm/second, and then the length "L" (mm) of a strand drawn out from the outermost surface of the collection of the aliphatic polycarbonate was measured. In addition, the zero-shear viscosity η of each sample was measured using a rheometer (TA Instruments, AR-2000EX). Each of the above values was substituted as an evaluation parameter into the following formula for calculation.

"Evaluation parameter"$(mm^{-1} \cdot Pa^{-1}) = L/(D \times v \times \eta)$ <Formula>

Table 4 shows the relationship between each sample, and average length of drawn-out strands (mm) and zero-shear viscosity (Pa·s) in this Experimental example. FIG. 3A is a graph showing the relationship between each sample and evaluation parameter representing stringiness in this Experimental example.

TABLE 4

| Sample | Average length of drawn-out strands (mm) | Zero-shear viscosity (Pa · s) | Evaluation parameter ($mm^{-1} \cdot Pa^{-1}$) |
|---|---|---|---|
| (1) | 2.62 | 0.14 | 1.31 |
| (2) | 2.74 | 0.41 | 0.47 |
| (3) | 2.59 | 0.27 | 0.67 |
| (4) | 113.51 | 58.7 | 0.13 |
| (5) | 129.58 | 392.5 | 0.02 |
| (6) | 124.77 | 279.4 | 0.03 |
| (7) | 51.37 | 5.7 | 0.62 |
| (8) | 54.80 | 7.7 | 0.49 |
| (9) | 38.36 | 11.8 | 0.22 |
| (10) | 65.45 | 29.4 | 0.15 |

The results in Table 4 and FIG. 3A showed that for a sample prepared by dissolving only one type of PPC as a binder, good "shape of patterning" and "stringiness" can be obtained when the value of the "evaluation parameter" ($mm^{-1} \cdot Pa^{-1}$) calculated by the above formula is 0.4 $mm^{-1}$ $Pa^{-1}$ or more.

Meanwhile, as indicated in Table 5 below, the results from (1) to (10) showed that the data from the samples of the oxide semiconductor precursors in which only one of the 4 types of PPCs having different mass-average molecular weights was dissolved as a binder, or the samples of the oxide semiconductor precursors in which two of the PPCs as binders were dissolved in combination had a similar trend. It is noted that the sample numbers used in Table 5 are the same as those used in Table 1 for clarifying the correspondence relationship with (1) to (10) in Table 1.

As shown in Tables 4 and 5 and FIGS. 3A and 3B, the "evaluation parameter" generally showed a larger value when the above samples of the oxide semiconductor precursors were used as compared with a case where samples having only one type of PPC dissolved as a binder were used. However, the inventors of this application assume that an impact of indium acetylacetonate, which is a solute contained in a very small amount, is very small. That is, the inventors of this application conclude that the results shown in Table 4 and FIG. 3A represent authentic and more generalizable experimental results.

Therefore, the results in Tables 3 to 5 and FIGS. 3B and 2B taken together for analysis based on the results from (9) and (10) in Table 5 revealed that good "shape of patterning" and "stringiness" were able to be obtained when the value of the "evaluation parameter" ($mm^{-1} \cdot Pa^{-1}$) was 0.25 $mm^{-1} \cdot Pa^{-1}$ or more (more strictly, 0.29 $mm^{-1} \cdot Pa^{-1}$ or more). It is noted that there is no particular limitation for the upper limit of the "evaluation parameter" for obtaining good "shape of patterning" and "stringiness," but it is preferably 1.2 or less (more strictly, 0.9 or less) in order to obtain the height of a pattern more reliably.

TABLE 5

| Sample | Average length of drawn-out strands (mm) | Zero-shear viscosity (Pa · s) | Evaluation parameter ($mm^{-1} \cdot Pa^{-1}$) |
|---|---|---|---|
| (1) | 2.33 | 0.10 | 1.56 |
| (2) | 2.65 | 0.29 | 0.64 |
| (3) | 2.57 | 0.21 | 0.84 |
| (4) | 92.71 | 54.9 | 0.12 |
| (5) | 126.65 | 340.5 | 0.03 |
| (6) | 115.49 | 96.9 | 0.08 |
| (7) | 29.69 | 2.5 | 0.83 |
| (8) | 36.47 | 3.4 | 0.73 |
| (9) | 30.26 | 7.2 | 0.29 |
| (10) | 65.96 | 15.6 | 0.29 |

(Other Preferable Molecular Weight Ranges of Aliphatic Polycarbonate)

In addition, the molecular weight range of aliphatic polycarbonate in this embodiment is not limited to the numeric range disclosed in each of the above experimental examples. As a result of analyses made by the inventors of this application, for example, aliphatic polycarbonate having a molecular weight of 6000 or more and 300000 or less constitutes 75% by mass or more of the entire aliphatic polycarbonate in order to more reliably control stringiness and form a good pattern in a further preferred aspect.

Experimental Example 3

(Evaluation of Contact Angle and Expansion Ratio)

As already described, aliphatic polycarbonate which can serve as an etching mask is to be decomposed and/or removed primarily in a heating step after the target of etching is etched using a pattern formed, for example, by the screen printing method. Therefore, the etching mask is only required for a limited time period. Nonetheless, the inventors of this application assumed that evaluation of the contact angle between an etching mask precursor and a base material when a solution containing aliphatic polycarbonate (that is, an "etching mask precursor") is placed on the base material can provide an indicator suitable for determining whether or not the solution has a pattern formability (in other words, well-balanced viscosity or wettability) enough for persisting during the limited time period.

Accordingly, the inventors of this application conducted the following study: a solution of polypropylene carbonate obtained by dissolving polypropylene carbonate (25 wt %) in a solvent mixture of DEGMEA and 2-nitropropane was placed on a base material (in this experimental example, a glass substrate), and then the contact angle between the base material and the solution and the expansion ratio of the solution on the base material were determined at 30 seconds and 120 seconds after placement to investigate how they changed over time. It is noted that the above evaluation was performed as a function of the concentration (wt %) of 2-nitropropane, which is a solvent suitable for aliphatic polycarbonate, in order to facilitate the study about how the contact angle changes. Further, the above "expansion ratio" was calculated based on the actual size of a pattern with respect to the designed value.

FIG. 4A is a graph showing the contact angle between a base material and a solution, and expansion ratio of the solution on the base material with respect to changes in the concentration of 2-nitropropane at 30 seconds after placement of the solution containing aliphatic polycarbonate on the base material. Furthermore, FIG. 4B is a graph showing the contact angle between a base material and a solution and expansion ratio of the solution on the base material with respect to changes in the concentration of 2-nitropropane at 120 seconds after placement of the solution containing aliphatic polycarbonate on the base material.

As depicted in FIG. 4A and FIG. 4B, the contact angle between the base material and the solution, and expansion ratio of the solution on the base material were found to be inversely correlated to each other. Specifically, it was revealed that as the concentration of 2-nitropropane increased, the contact angle increased and the expansion ratio decreased. However, as depicted in FIG. 4B, even when the concentration of 2-nitropropane was high (for example, 75%), there was a case in which the contact angle did not increase. Moreover, it was revealed that particularly the contact angle was observed to tend to sharply increase when the concentration of 2-nitropropane reached a level (typically, 55% or more and 60% or less), as depicted in both FIG. 4A and FIG. 4B.

According to further research and analyses made by the inventors of this application, it was found that a case in which the contact angle exceeds 36° at the stage of 30 seconds after placement, or, a case in which the contact angle exceeds 32° at the stage of 120 seconds after placement results in a situation where a solution containing aliphatic polycarbonate is repelled from the base material, making it difficult to sufficiently form a pattern that can be kept for a temporary time. Accordingly, a solution containing aliphatic polycarbonate is preferably prepared to achieve the above contact angle or less.

On the other hand, the results also revealed that when the contact angle at 30 seconds after the placement was less than 30°, or the contact angle at 120 seconds after the placement was less than 26°, the reproducibility of patterns was poor, and thus a pattern substantially persisting for a temporary time was difficult to be formed. Therefore, the solution containing aliphatic polycarbonate is preferably prepared so as to show an angle larger than each of the above contact angles. Considering all of the above, the contact angle of an etching mask precursor and a base material is preferably 30° or more and 36° or less at 30 seconds after placement of the etching mask precursor on the base material, or the contact angle of an etching mask precursor and a base material is preferably 26° or more and 32° or less at 120 seconds after placement of the etching mask precursor on the base material.

Furthermore, the results depicted in FIG. 4A and FIG. 4B above were confirmed to correlate with the results of samples of the oxide semiconductor precursor explained in "preparation step for each experiment", which were each prepared by dissolving one of 4 types of PPC differing in mass-average molecular weight as a binder, or, samples of the oxide semiconductor precursor prepared by dissolving a combination of any 2 out of the 4 types of the same as a binder.

As described above, it can be confirmed that the result of a solution containing aliphatic polycarbonate, but containing no oxide precursor in the experimental example was approximately equivalent to that of a solution containing aliphatic polycarbonate and an oxide precursor in the Example.

2. Oxide Precursor, Configuration of Oxide Layer, and Method of Producing these

In this embodiment, an "oxide precursor" represents a typical aspect in which aliphatic polycarbonate is mixed with a compound of a metal to be oxidized into a metal oxide. Therefore, a typical example of the above oxide precursor is a solution containing aliphatic polycarbonate in which a compound of a metal to be oxidized into a metal oxide is dispersed. Further, as already described, examples of the above metal oxide include oxide semiconductors, oxide conductive materials, or oxide insulators. It is noted that once a pattern is formed, for example, by the screen printing method, aliphatic polycarbonate may be considered as an impurity with respect to the metal oxide finally obtained, and thus it will be decomposed and/or removed primarily in a heating step.

It is noted that examples of the metal oxide in this embodiment include oxide semiconductors, oxide conductive materials, or oxide insulators. Further, in this embodiment, the percentage of aliphatic polycarbonate having a molecular weight of 6000 or more and 400000 or less is 80% by mass or more relative to the entire aliphatic polycarbonate as in the case of the etching mask precursor or etching mask. In addition, materials and production methods which can be used for the etching mask precursor or etching mask may also be used except that the aforementioned metal compound is mixed. Moreover, as a typical example, a method of producing an oxide semiconductor precursor and an oxide semiconductor layer are disclosed in detail in Patent Document 4 (WO2015-019771) filed by the applicant of this application. Therefore, descriptions common with the etching mask precursor or etching mask will be omitted.

Second Embodiment

1. Overall Structure of Thin Film Transistor According to Present Embodiment

FIGS. 5 to 9B, 9D, 10A, 14, and 15 are each a schematic sectional view of a process in the method of producing a thin film transistor 100 as an exemplary semiconductor element. It is noted that FIG. 15 is a schematic sectional view of a process in the method of producing the thin film transistor 100 according to the present embodiment and the overall structure of the thin film transistor. As shown in FIG. 15, the thin film transistor 100 according to the present embodiment includes a substrate 10, on which a gate electrode 24, a gate insulator 34, a channel 44, a source electrode 58, and a drain electrode 56 are stacked from the lower side in the mentioned order. Further, production or implementation of an electronic device including the above semiconductor element (e.g. a mobile terminal, an information appliance, or any other publicly known electric appliance) can be fully understood without any further explanation by a person skilled in the art who understands the semiconductor element according to the present embodiment. Further, various steps for forming an oxide precursor layer, which are described below, are included in the "oxide precursor layer forming step" in this application.

The thin film transistor 100 has the so-called bottom gate structure, although this embodiment is not limited to this structure. A person skilled in the art having ordinary technical knowledge can thus form the top gate structure by changing the order of the steps with reference to the description of this embodiment. Temperatures indicated in this application are surface temperatures of the heating surface of a heater, which comes into contact with a substrate. Patterning of an extraction electrode from each electrode is not depicted in order for simplification of the drawings.

There is no particular limitation for the substrate 10 according to the present embodiment, but a substrate commonly used for semiconductor elements may be used. Various base materials may be used, including highly heat resistant glass, an $SiO_2$/Si substrate (i.e. a substrate in which an oxide silicon film is formed on a silicon substrate), an alumina ($Al_2O_3$) substrate, an STO (SrTiO) substrate, an insulating substrate in which an STO (SrTiO) layer is formed over a surface of an Si substrate through a $SiO_2$ layer and a Ti layer, and the like, and semiconductor substrates (e.g. a Si substrate, a SiC substrate, and a Ge substrate). It is noted that examples of the insulating substrate include films or sheets made of materials such as polyesters including polyethylene terephthalate and polyethylene naphthalate; polyolefins; cellulose triacetate; polycarbonate; polyamide; polyimide; polyamide imide; polysulfone; aramid; and aromatic polyamide. Further, there is no particular limitation for the thickness of a substrate, but it is, for example, 3 μm or more and 300 μm or less. Moreover, the substrate may be hard, or may be flexible.

2. Method of Manufacturing Thin Film Transistor According to Present Embodiment (1) Formation of Gate Electrode In this embodiment, a compound of a metal to be oxidized into an oxide conductive material (hereinafter, may also simply be referred to as an "oxide conductive material") may be used as a material for the gate electrode 24. In this case, the gate electrode 24 in this embodiment is formed by annealing a layer of an oxide conductive material precursor (hereinafter, may also be referred to as an "oxide conductive material precursor layer") in which an oxide conductive material (may include inevitable impurities. The same shall apply to oxides of other materials in addition to the oxide of this material) is dispersed in a solution containing aliphatic polycarbonate. In this embodiment, as shown in FIG. 5, a gate electrode precursor layer 22 can be formed by applying a gate electrode precursor solution as a starting material onto a $SiO_2$/Si substrate 10 as a base material (hereinafter, may also simply be referred to as a "substrate") by a low-energy production process (for example, a printing method or a spin coating method).

Subsequently, an annealing step for annealing the gate electrode precursor layer 22 in air for a predetermined time period (for example, 10 minutes to 1 hour) at 450° C. to 550° C. is performed, for example. As a result, as depicted in FIG. 6, the gate electrode 24 is formed on the substrate 10. In addition, the thickness of the layer of the gate electrode 24 in this embodiment is about 100 nm, for example.

Here, one example of the above oxide conductive material is a material having a structure (typically a complex structure) in which a ligand is coordinated with a metal to be oxidized into an oxide conductive material. Examples of the oxide conductive material according to the present embodiment can include metal organic acid salts, metal inorganic acid salts, metal halides, and various metal alkoxides. It is noted that an example of a metal to be oxidized into an oxide conductive material is ruthenium (Ru). In this embodiment, an annealing step is performed to form ruthenium oxide as an oxide conductive material, with which the gate electrode 24 can be formed, the annealing step including annealing a gate electrode precursor solution, for example, in air for a predetermined time period (for example, 10 minutes to 1 hour) at about 450° C. to about 550° C., the gate electrode precursor solution being prepared using a solution as a starting material in which ruthenium (III) nitrosylacetate is dissolved in a solvent mixture of propionic acid and 2-aminoethanol containing aliphatic polycarbonate.

In this embodiment, in particular, when a gate electrode precursor solution containing the aliphatic polycarbonate described in the first embodiment is used, a good pattern of the gate electrode precursor layer 22 can be formed by a printing method. More specifically, the stringiness of aliphatic polycarbonate in the gate electrode precursor solution can be controlled in an appropriate manner, leading to formation of a good pattern of the gate electrode precursor layer 22.

In this embodiment, instead of the above gate electrode 24, high melting metal such as platinum, gold, silver, copper, aluminum, molybdenum, palladium, ruthenium, iridium, or tungsten, a metal material such as an alloy thereof, a $p^+$-silicon layer, or an $n^+$-silicon layer can be applied, for example. In this case, the gate electrode 24 can be formed on the substrate 10 in accordance with a known sputtering technique or a known CVD technique.

(2) Formation of Gate Insulator

Furthermore, in this embodiment, a gate insulator 34 can be formed by annealing a layer of an oxide insulator precursor (hereinafter, may also be referred to as an "oxide insulator precursor layer") in which a compound of a metal to be oxidized into an oxide insulator (hereinafter may also simply be referred to as an "oxide insulator") is dispersed in a solution containing aliphatic polycarbonate.

Specifically, as depicted in FIG. 7, a gate insulator precursor layer 32 is formed by applying the above oxide insulator precursor onto the gate electrode 24 in accordance with a low-energy production process (e.g. a printing method or a spin coating method).

The gate insulator precursor layer 32 in a gel state is then subjected to the annealing (main annealing) step for annealing at about 450° C. to about 550° C. for a predetermined time period (e.g. 10 minutes to 1 hour) in air, for example, thereby forming an oxide of lanthanum (La) and zirconium (Zr), which is an oxide insulator. As a result, as depicted in FIG. 8, the gate insulator 34 can be formed. In addition, the thickness of the layer of the gate insulator 34 of this embodiment ranges from about 100 nm to about 250 nm, for example.

An example of the above oxide insulator is a material having a structure (typically a complex structure) wherein a ligand is coordinated with a metal to be oxidized into an oxide insulator. Examples of the oxide insulator of this embodiment can include metal organic acid salts, metal inorganic acid salts, metal halides, and various metal alkoxides, or, other organic acid salts, inorganic acid salts, halides, or various alkoxides.

It is noted that a typical example of the oxide insulator is an oxide including lanthanum (La) and zirconium (Zr). This oxide can be used as the gate insulator 34. In this embodiment, a first solution is prepared in which lanthanum (III) acetate is dissolved in propionic acid (a solvent) containing aliphatic polycarbonate, and a second solution is prepared in which zirconium butoxide is dissolved in propionic acid (a solvent) containing aliphatic polycarbonate. A gate insulator precursor solution as a starting material in which the first solution and the second solution are mixed can be subjected to an annealing step for annealing, for example, in air for a predetermined time period (for example, 10 minutes to 1 hour) at about 450° C. to about 550° C. to form an oxide insulator.

In this embodiment, in particular, when an oxide insulator precursor containing the aliphatic polycarbonate described in the first embodiment is used, a good pattern of the gate insulator precursor layer 32 can be formed by a printing method. More specifically, the stringiness of aliphatic polycarbonate in the oxide insulator precursor can be controlled in an appropriate manner, leading to formation of a good pattern of the gate insulator precursor layer 32.

Moreover, in this embodiment, oxide silicon or silicon oxynitride can be applied, for example, instead of the above gate insulator 34. In this case, the gate insulator 34 can be formed on the gate electrode 24 by a known CVD technique, for example.

(3) Formation of Channel

Further, in this embodiment, a channel 44 can be formed by annealing a layer of an oxide semiconductor precursor (hereinafter, may also be referred to as an "oxide semiconductor precursor layer") in which a compound of a metal to be oxidized into an oxide semiconductor (hereinafter, may also simply be referred to as "oxide semiconductor") is dispersed in a solution containing aliphatic polycarbonate. In this embodiment, a channel precursor layer 42 can be formed by applying a channel precursor solution as a starting material onto the gate insulator 34 by a low-energy production process (for example, a printing method or a spin coating method) as shown in FIG. 9A.

Subsequently, the channel precursor layer 42 is subjected to an annealing step described below to form the channel 44 as shown in FIG. 10A.

Here, an example of the oxide semiconductor is a material having a structure (typically a complex structure) in which a ligand is coordinated with a metal to be oxidized into an oxide semiconductor. Examples of a material to be used for forming the oxide semiconductor according to the present embodiment can include metal organic acid salts, metal inorganic acid salts, metal halides, and various metal alkoxides. It is noted that a typical example of the oxide semiconductor is indium-zinc oxide. For example, indium-zinc oxide (hereinafter, may also be referred to as "InZnO") as an oxide semiconductor can be formed by performing an annealing step of annealing a solution in which indium acetylacetonate and zinc chloride are dissolved in propionic acid including aliphatic polycarbonate (may also be referred to as an "InZn solution") at 450° C. to 550° C. for a predetermined time (for example, 10 minutes to 1 hour) in air. As a result, the channel 44 can be formed.

Examples of the metal to be oxidized into an oxide semiconductor include one, two, or more members selected from the group consisting of indium, tin, zinc, cadmium, titanium, silver, copper, tungsten, nickel, indium-zinc, indium-tin, indium-gallium-zinc, antimony-tin, and gallium-zinc. In terms of element performance, stability, and the like, indium-zinc is preferably adopted as the metal to be oxidized into an oxide semiconductor.

In this embodiment, in particular, when a channel precursor solution containing the aliphatic polycarbonate described in the first embodiment is used, a good pattern of the channel precursor layer 42 can be formed by a printing method. More specifically, the stringiness of aliphatic polycarbonate in the channel precursor solution can be controlled in an appropriate manner, leading to formation of a good pattern of the channel precursor layer 42.

Moreover, in this embodiment, in particular, when the channel 44 as an oxide semiconductor layer is formed, a method of producing a metal oxide according to one embodiment of the invention which has been invented by the inventors of this application, for example, a method disclosed in Patent Document 4, can be used as a preferred example.

A typical method of forming the channel 44 involves: a precursor layer forming step of forming an oxide semiconductor precursor on or above a substrate to form a layer, the oxide semiconductor precursor having a compound of a metal to be oxidized into the oxide semiconductor dispersed in a solution containing aliphatic polycarbonate; and an annealing step of heating the precursor layer to a first temperature at which 90 wt % or more of aliphatic polycarbonate is decomposed, and then annealing the precursor layer at a temperature higher than the first temperature and equal to or higher than a second temperature at which the metal binds to oxygen, and where an exothermic peak is observed as determined by differential thermal analysis (DTA) of the precursor or the metal compound.

<TG-DTA (Thermogravimetry and Differential Thermal Analysis) Properties>

More specifically, FIG. 11 is a graph showing the TG-DTA properties of an indium-zinc-containing solution as an example of a material for forming the oxide precursor according to the first embodiment, which will serve as an oxide semiconductor precursor for forming a channel of a thin film transistor. Further, FIG. 12 is a graph showing an example of the TG-DTA properties of a solution of polypropylene carbonate as an example of a solution (a typical example of an etching mask precursor) containing aliphatic polycarbonate alone as a solute for forming a component (for example, a channel) of a thin film transistor. It is noted that as shown in FIGS. 11 and 12, solid lines in the figures represent results from thermogravimetric (TG) measurements, and dotted lines in the figures represent results from differential thermal analysis (DTA) measurements.

Results from the thermogravimetric measurements in FIG. 11 showed a significant weight loss at around 120° C. probably due to evaporation of the solvent. The results also showed an exothermic peak at around 330° C. in the graph of the differential thermal analysis of the InZn solution as indicated by (X) in FIG. 11. This thus indicates that indium and zinc are bound with oxygen at around 330° C. Therefore, this temperature of 330° C. corresponds to the aforementioned second temperature.

In contrast, the results in FIG. 12 from the thermogravimetric measurements showed a significant weight loss at around 140° C. to 190° C. due to partial decomposition or elimination of polypropylene carbonate itself as the solvent in the solution of polypropylene carbonate disappeared. It is noted that polypropylene carbonate appears to be converted into carbon dioxide and water by the above decomposition. The results in FIG. 12 also showed that 90 wt % or more of aliphatic polycarbonate was decomposed and removed at around 190° C. Therefore, this temperature of 190° C. corresponds to the aforementioned first temperature. More detailed analysis revealed that 95 wt % or more of aliphatic polycarbonate was decomposed at around 250° C., and almost all (99 wt % or more) of aliphatic polycarbonate was decomposed at around 260° C. Therefore, use of an etching mask precursor including a type of aliphatic polycarbonate which can be substantially or predominantly eliminated or removed by heat treatment at 250° C. or more (more preferably 260° C. or more) can reliably reduce or prevent effects on a layer to be etched (typically, adverse effects on electrical properties). It is noted that the above results were obtained when aliphatic polycarbonate was decomposed by relatively brief heat treatment. However, aliphatic polycarbonate was found to be substantially decomposed even at a lower temperature (for example, 180° C.) when a longer heat treatment is performed. Therefore, use of an etching mask precursor including a type of aliphatic polycarbonate which can be substantially or predominantly eliminated or removed by heat treatment at 180° C. or more can reduce or prevent effects on a layer to be etched (typically, adverse effects on electrical properties).

Further, studies conducted by the inventors of this application showed that when heated (for example, using a known heater) while applying ultraviolet rays (for example, a low-pressure mercury lamp (Model UV-300 H-E, SAMCO) is used, and the ultraviolet rays have wavelengths of 185 nm and 254 nm), the first temperature was able to be lowered by tens of degrees (for example, about 30° C.) as compared with a temperature when heated without use of ultraviolet irradiation. Therefore, in a heating step for decomposing aliphatic polycarbonate, heating is preferably performed while applying ultraviolet rays to each oxide layer precursor and/or etching mask at or above a temperature where organic substances, for example, the aforementioned organic solvent, the organic portion of the aforementioned complex structure, or the aforementioned aliphatic polycarbonate are decomposed. This is because the final oxide layer preferably includes the organic portions of the aforementioned solute, the aforementioned solvent, or the aforementioned aliphatic polycarbonate as less as possible. It is noted that the ultraviolet rays do not necessarily need to be applied after decomposition of the organic substances in the above heating step, but in a more preferred aspect, heating is performed while applying ultraviolet rays to each oxide precursor layer and/or etching mask at or above a temperature where the oxide layer is formed. It is noted that there is no particular limitation for the wavelengths of the ultraviolet rays. Ultraviolet rays having wavelengths other than 185 nm or 254 nm can show a similar effect.

The temperature (the second temperature) where an exothermic peak is observed in differential thermal analysis (DTA) at which a metal in an oxide semiconductor binds to oxygen is preferably sufficiently higher than the temperature at which aliphatic polycarbonate is decomposed, or the temperature at which aliphatic polycarbonate is decomposed is sufficiently lower than the temperature (the second temperature) at which the exothermic peak is observed. If that is the case, 90 wt % or more (more preferably 95 wt % or more, even more preferably 99 wt % or more, and most preferably 99.9 wt % or more) of aliphatic polycarbonate can be decomposed more reliably.

Further, an etching mask can be reliably eliminated or removed when heat treatment is performed at a temperature where aliphatic polycarbonate is decomposed (typically, at the first temperature or above, preferably 180° C. or above, more preferably 250° C. or above, and even more preferably 260° C. or above). Strikingly, this can reliably reduce or eliminate effects on the electrical properties of an oxide (including not only a semiconductor but also a conductive material or an insulator) formed by heating at the second temperature or above.

According to the research and analyses conducted by the inventors of this application, a difference between the first temperature and the second temperature is 10° C. or higher, more preferably 50° C. or higher, and further preferably 100° C. or higher, leading to the reduction of impurities represented by carbonous impurities remaining in the oxide layer.

The oxide semiconductor is not particularly limited in terms of its phase state. For example, the oxide semiconductor may be in any one of the crystal form, the polycrystalline form, and the amorphous form. The present embodiment can also cover a phase state where grown crystal has a branch form or a scale form. Furthermore, the present embodiment is obviously not particularly limited by a patterned shape (e.g. a spherical shape, an elliptical shape, or a rectangular shape).

(Step of Forming and Annealing Pattern of Channel Precursor Layer)

Next, a specific method of forming a pattern of the channel 44 will be described. It is noted that this method of forming a pattern of the channel 44 can also be applied partially or almost completely to manufacture of the aforementioned oxide conductive materials or oxide insulators (that is, various oxide layers).

As already described, in this embodiment, the channel precursor layer 42 is formed by applying a channel precursor solution onto the gate insulator 34 in accordance with a low-energy production process (e.g., a spin coating method) as shown in FIG. 9A. It is noted that there is no particular limitation for the thickness (wet) of the channel precursor layer 42 as an oxide semiconductor precursor layer.

Subsequently, a channel precursor layer 42 having a thickness of about 600 nm is formed by heating, for example, at 150° C. for a predetermined period (e.g. 3 minutes) in the preliminary annealing (may also be referred to as the "first preliminary annealing") step. The first preliminary annealing step is performed mainly for the purpose of promoting gelation and fixation of the channel precursor layer 42 on the gate insulator 34.

In this embodiment, a pattern of an etching mask 80 formed from the etching mask precursor according to the first embodiment is then formed on the channel precursor layer 42 by the screen printing method (an etching-mask forming step) as shown in FIGS. 9B and 9C. It is noted that in FIG. 9C as well as FIGS. 9E and 10B described below, only the "step of forming and annealing a pattern of a channel precursor layer" is selected and imaged (plan view photographs) for clarity.

Subsequently, a pattern of the channel precursor layer 42 is formed using the etching mask 80. Specifically, the etching mask 80 and the channel precursor layer 42 are brought into contact with a commercially available etching solution (Product name: "ITO-02," Kanto Chemical Co., Inc.) in which the oxide precursor layer can be dissolved (typically, immersed into the etching solution) (a contact step). As a result, a portion of the channel precursor layer 42 not protected by the pattern of the etching mask 80 is etched and removed as shown in FIGS. 9D and 9E. On the other hand, a portion of the channel precursor layer 42 protected by the pattern of the etching mask 80 is not etched, and remains on the gate insulator 34.

Subsequently, a second preliminary annealing step (a drying step) is performed at a predetermined temperature (the first temperature) in order to decompose the etching mask 80 (in particular, aliphatic polycarbonate) and aliphatic polycarbonate in the channel precursor layer 42 with which the pattern has been formed.

In the second preliminary annealing step according to the present embodiment, heating is performed at a temperature where 90 wt % or more of aliphatic polycarbonate is decomposed. Through the second preliminary annealing step and the main annealing (the annealing step) described below, the etching mask 80 itself and impurities contained in the final channel precursor layer 42 such as, in particular, carbonous impurities originated from aliphatic polycarbonate can be mostly eliminated. In order to reliably reduce residual impurities in the channel 44 such as in particular carbonous impurities originated from aliphatic polycarbonate, the first temperature is preferably such that 95 wt % or more of aliphatic polycarbonate is preferably decomposed at that temperature, and more preferably such that 99 wt % or more of aliphatic polycarbonate is decomposed at that temperature.

The second preliminary annealing step is not limited to include drying at normal temperature under normal pressure. For example, the second preliminary annealing step can include treatment such as heating or decompressing such as drying by heating, decompression drying, or decompression drying by heating, as long as the substrate, the gate insulator, and the like are not adversely affected. The second preliminary annealing step can possibly influence the increase or decrease in surface roughness of the oxide semiconductor layer. Because behavior during drying differs depending on the solvent, conditions such as the temperature (first temperature) in the second preliminary annealing step are set appropriately in accordance with the type of the solvent.

The second preliminary annealing according to the present embodiment can be exemplified by heating the channel precursor layer 42 at a temperature in the range of from 180° C. or higher to 300° C. or lower for a predetermined period (e.g. 30 minutes). The above preliminary annealing is performed in an oxygen atmosphere or in the atmosphere (hereinafter, also collectively called an "oxygen-containing atmosphere"), for example. According to an adoptable aspect, the second preliminary annealing step is performed in a nitrogen atmosphere.

Subsequently, in the main annealing, i.e., "the annealing step," the etching mask 80 and the channel precursor layer 42 are heated, for example, under an oxygen-containing atmosphere for a predetermined time period in a range of 180° C. or above, more preferably 250° C. or above, even more preferably 300° C. or above, and still more preferably 500° C. or above in terms of electrical properties. As a result, the channel 44 as an oxide semiconductor layer is formed on the gate insulator 34 as shown in FIGS. 10A and 10B. Strikingly, the etching mask 80 is also decomposed and/or removed in the main annealing step (the heating step in this embodiment). This means that in this embodiment, removal of an etching mask and formation of an oxide layer (the oxide-layer forming step) can be achieved simultaneously. Therefore, use of the etching mask 80 can significantly simplify the production process. It is noted that the final thickness of an oxide semiconductor layer after the main annealing is typically 0.01 μm or more and 10 μm or less. In particular, it is worth noting that the resulting layer is resistant to cracks even when it has a thickness as thin as about 0.01 μm (or 10 nm).

Here, the preset temperature in the above annealing step is selected so that it corresponds to a temperature at which a ligand of an oxide semiconductor is decomposed in the oxide semiconductor forming process, and a metal thereof is allowed to bind to oxygen, and further so that it is equal to or above a temperature where an exothermic peak is observed in differential thermal analysis (DTA) as described above (the second temperature). In the above annealing step, aliphatic polycarbonate, a dispersant, and an organic solvent in the channel precursor layer 42 are to be reliably decomposed and/or removed. It is noted that in a preferred aspect, the second temperature is higher than the first temperature by 10° C. or more in order to reliably reduce residual impurities such as carbonous impurities in the oxide semiconductor layer after the main annealing. In addition, when the second temperature is higher than the first temperature by 50° C. or more, such residual impurities can be reduced even more reliably. In the most preferred aspect, the second temperature is higher than the first temperature by 100° C. or more in view of the controllability of the thickness and/or the thinning of the final oxide semiconductor layer as well as reduction of residual impurities. Nonetheless, there is no particular limitation for the maximum difference between the second temperature and the first temperature.

Our analysis suggests that aliphatic polycarbonate is mostly decomposed when heated to the first temperature, and thus in the subsequent annealing step (the main annealing) at the second temperature, almost no decomposition reaction of aliphatic polycarbonate takes place, and a reaction of bonding a metal with oxygen takes place almost exclusively. That is, ideally, two different functions of the first temperature and the second temperature can allow cracks to be less generated even in the case of a very thin layer as described above.

Meanwhile, the channel 44 protected by the etching mask 80 was found to show a rectification behavior as a semiconductor when etching treatment was performed using the etching mask 80 according to the present embodiment. Interestingly, a channel protected by using a commercially available resist as an etching mask was, however, found to show no rectification behavior under some circumstances even though the conditions were the same except for the material of the etching mask.

FIG. 13 is a graph showing the rectification behavior of the channel 44 which is a part of the thin film transistor 100 according to the present embodiment. As shown in this graph, the rectification behavior as a semiconductor can be obtained when etching treatment was performed using the etching mask 80 according to the present embodiment. This can be attributed to reliable removal of the etching mask 80 in the heating step when forming a pattern of the oxide layer, or in other words reliable removal of residual impurities which may affect the electrical properties of a semiconductor. Further, another striking advantage of the etching mask 80 according to the present embodiment is that use of the etching mask 80 according to the present embodiment can eliminate any effect on the so-called back channel region, which otherwise may occur upon detaching a resist. It is noted that the mixing ratio (by the mass ratio) of indium and zinc used in the graph is adjusted to 1:1 by adjusting the molar ratio per kg of indium acetylacetonate and zinc chloride. However, the mixing ratio of indium and zinc is not limited to the above ratio. For example, the inventors of this application observed the rectification behavior of the channel 44 even when the ratio of indium to zinc was 2:1. Therefore, in a preferred aspect, the method of manufacturing a thin film transistor includes an oxide-layer forming step of forming an oxide layer (the channel 44) protected by the etching mask 80 in a way such that it makes contact with the gate electrode 24 through the gate insulator 34, the oxide layer being formed via the heating step in the method of producing an oxide layer according to the present embodiment.

None of the first preliminary annealing step, the second preliminary annealing step, and main annealing (the annealing step) described above is particularly limited in terms of its heating/annealing method. The heating method can be exemplified by a conventional heating method with use of a thermostat, an electric furnace, or the like. Particularly in a case where the substrate is less heat-resistant, it is preferred to adopt a method of heating/annealing only the oxide semiconductor layer by means of ultraviolet rays, electromagnetic waves, or a lamp for prevention of heat transfer to the substrate.

In the processes of removing the etching mask 80 and forming the channel 44, aliphatic polycarbonate can contribute to reducing or eliminating decomposition products remaining in the oxide semiconductor layer after the annealing decomposition, and further contribute to forming minute patterns of the oxide semiconductor layer. Therefore, in a preferred aspect of the present embodiment, aliphatic polycarbonate is used.

The studies conducted by the inventors of this application also demonstrated that in this embodiment, the final thickness of the channel 44 was able to be controlled by varying the weight ratio of aliphatic polycarbonate and a compound of a metal to be oxidized into an oxide semiconductor, or varying the concentration of aliphatic polycarbonate or a compound of a metal. For example, our studies showed that the channel 44 having a thickness ranging from 10 nm to 50 nm, which can be considered as a very thin layer, was able to be formed without generating cracks. It is noted that in addition to a thin layer as described above, a layer having a thickness of 50 nm or more can be formed relatively easily by appropriately adjusting the thickness of the channel precursor layer 42, the aforementioned weight ratio, and the like. In general, a layer used for a channel has a thickness of 0.01 μm (i.e. 10 nm) or more and 1 μm or less. This means that the oxide semiconductor precursor and the oxide semiconductor layer according to the present embodiment, in which the final thickness of the channel 44 can be controlled, are suitable as a material for manufacturing a thin film transistor.

In addition, when the oxide semiconductor precursor according to the present embodiment is used, the resulting oxide semiconductor precursor layer, which may be considerably thick (e.g. 10 μm or more) at the initial stage, can be made extremely thin (e.g. 10 nm to 100 nm) after annealing because aliphatic polycarbonate and the like are reliably decomposed in the subsequent annealing step. Strikingly, no crack is developed, or development of cracks is reliably reduced even when the resulting layer is very thin as described above. This indicates that the oxide semiconductor precursor and the oxide semiconductor layer according to the present embodiment, which can be formed to have both a sufficiently large initial thickness and a very thin final thickness, are very suitable for a low-energy production process or a known imprinting process. Further, use of the oxide semiconductor layer, in which no crack is developed, or development of cracks is reliably reduced even when it is very thin, will significantly improve the stability of the thin film transistor 100 according to the present embodiment.

Further, in this embodiment, the electrical properties and stability of the oxide semiconductor layer which will form a channel can be improved by appropriately selecting the type and combination of the oxide semiconductors, and adjusting the mixing ratio of the oxide semiconductor(s) and aliphatic polycarbonate.

(4) Formation of Source Electrode and Drain Electrode

Subsequently, a layer of the etching mask 80 according to the present embodiment patterned on the channel 44 was further formed in a way similar as in the method of forming the channel 44. Then, as shown in FIG. 14, an ITO layer 50 is formed on the channel 44 and the etching mask 80 by the publicly known sputtering method. The target material used in this embodiment includes an ITO containing, for example, 5 wt % of tin oxide ($SnO_2$), and is formed under conditions of room temperature to 100° C. Once the etching mask 80 is then removed by heating to about 250° C., a drain electrode 56 and a source electrode 58 made of the ITO layer 50 is formed on the channel 44. As a result, the thin film transistor 100 is manufactured as shown in FIG. 15. It is noted that in another conceivable aspect, a pattern of a publicly known resist layer formed by the conventional photolithographic method may also be used in place of the etching mask 80.

Furthermore, in this embodiment, a method of forming a drain electrode pattern and a source electrode pattern using paste silver (Ag) or paste ITO (indium tin oxide) according to a printing method, for example, instead of the above drain electrode 56 and source electrode 58, is an adoptable aspect. Moreover, a gold (Au) or aluminum (Al) drain electrode pattern and a gold (Au) or aluminum (Al) source electrode pattern formed by a known evaporation method may also be employed instead of the drain electrode 56 and the source electrode 58.

Modification Example (1) of Second Embodiment

The thin film transistor according to this embodiment is similar to the thin film transistor 100 according to the second embodiment in terms of the production process and configuration thereof except that etching treatment was performed using the etching mask 80 after the step (the main annealing) of annealing a channel according to the second embodiment. Therefore, descriptions common with the first or second embodiment will be omitted.

In this embodiment, a step of forming a pattern of the channel 44 is performed after forming the channel 44 as an oxide semiconductor layer. Therefore, in this modification example (1), etching of the oxide precursor layer to be oxidized into an oxide layer as performed in the second embodiment is not performed.

FIGS. 16A and 16B are each a schematic sectional view of a process in the method of producing a thin film transistor as an example of a semiconductor element. It is noted that the structure shown in FIG. 9A according to the second embodiment has been formed before the step shown in FIG. 16A. Further, the structure shown in FIG. 10A according to the second embodiment will be formed after the step shown in FIG. 16B.

In a conceivable aspect, the channel 44 after the main annealing is formed before performing etching treatment as shown in this modification example (1). As shown in FIG. 16A, a pattern of the etching mask 80 as described in the second embodiment is formed on the channel 44. Then, the etching mask 80 and the channel 44 are exposed to a solution for dissolving the channel 44 as an oxide layer (typically immersed into this etching solution), and then heated to or above a temperature at which the etching mask 80 is decomposed. As a result, the channel 44 on which a pattern is formed can be obtained as shown in FIG. 16B. It is noted that in this modification example (1), a portion of the oxide layer (the channel 44) protected by the etching mask 80 (more specifically, a pattern of the etching mask 80) can also show a rectification behavior as a semiconductor.

Modification Example (2) of Second Embodiment

Further, in the second embodiment or in the modification example (1) of the second embodiment, a pattern of the channel 44 is formed via the contact step of allowing contact with a predetermined etching solution as a solution for dissolving an oxide precursor layer or a solution for dissolving an oxide layer, but in the second embodiment, it is not limited to a treatment in which the etching solution is used. For example, in a conceivable aspect, an exposure step of allowing exposure to a publicly known gaseous plasma for etching the channel precursor layer 42 as an oxide semiconductor precursor layer according to the second embodiment can be used to etch a region of the channel precursor layer 42 which is not protected by the etching mask 80. As a result, a region of the channel precursor layer 42 which has not been exposed to the plasma will serve as the channel 44 after the subsequent heating step. In addition, the etching mask 80 can be decomposed and/or eliminated in the heating step. As a result, decomposition and/or removal of the etching mask 80 can be achieved in one treatment step (the heating step) along with formulation of the channel 44. Further, the modification example (2) can also be applied to the examples described in the modification example (1) of the second embodiment. Specifically, in another conceivable aspect, the step of forming a pattern of the channel 44 via the exposure step of exposure to plasma may be performed after forming the channel 44 as an oxide semiconductor layer. In all of the aforementioned cases, the channel 44 on which a pattern is formed can show a rectification behavior as a semiconductor.

Modification Example (3) of Second Embodiment

In the second embodiment, the etching mask 80 formed by the screen printing method is used to form a pattern of the channel 44. In another conceivable aspect, the etching mask 80 formed by the screen printing method may be used to form a pattern of other layers (for example, an oxide conductive material layer or an oxide insulator layer). Even when the etching mask 80 is used for the aforementioned other layers, the resulting oxide conductive material layer on which a pattern is formed can show electric conductivity, and the resulting oxide insulator layer on which a pattern is formed can show insulation performance.

Alternative Embodiments (1)

In each of the above embodiments, an oxide precursor layer or an oxide layer is a target of the etching treatment, but each of the above embodiments is not limited to these examples. For example, the etching mask used in each of the above embodiments can be used to form a pattern of a metal by etching a portion of that metal.

FIG. 17A is a plan view photograph showing the result of etching treatment of a chromium (Cr) layer using the etching mask according to the first embodiment. Further, FIG. 17B is a plan view photograph showing the result of etching treatment of a chromium (Cr) layer using an etching mask (a known resist mask) as Comparative Example of FIG. 17A.

As shown in FIG. 17A, residues of the etching mask were not visually observed when the etching treatment of a chromium (Cr) layer was performed using the etching mask according to the first embodiment. However, when the etching treatment of a chromium (Cr) layer was performed using the resist mask according to Comparative Example, many residues of the resist mask were visually observed as shown in FIG. 17B. It is noted that this etching treatment was found not to substantially alter the electrical properties (electric conductivity) as a metal. Further, even when other metals are etched, similar effects as the above are observed. Therefore, use of the etching mask according to the first embodiment enables the etching mask after etching treatment to be reliably removed even when the target of etching treatment is a metal.

Alternative Embodiments (2)

Further, the etching mask used in each of the above embodiments can be used, for example, to form a pattern of an insulator by etching a portion of that insulator. FIG. 18 shows a plan view photograph showing the result of etching treatment of a silicon dioxide layer (SiO$_2$) using the etching mask according to the first embodiment.

As shown in FIG. 18, when the etching treatment of the silicon dioxide (SiO$_2$) layer was performed using the etching mask according to the first embodiment, no residue of the etching mask was visually observed. It is noted that this etching treatment was found not to substantially alter the electrical properties (insulation performance) of the silicon dioxide (SiO$_2$) layer. Further, even when other insulators are etched, similar effects as the above are observed. Therefore, use of the etching mask according to the first embodiment enables the etching mask after etching treatment to be reliably removed even when the target of etching treatment is an insulator.

Alternative Embodiments (3)

Meanwhile, in the second embodiment and the modification examples thereof, a thin film transistor having a so-called inverted-staggered structure is described, but each of the above embodiments is not limited to this structure. For example, in addition to a thin film transistor having the staggered structure, a thin film transistor having the so-called planar structure in which a source electrode, a drain electrode, and a channel are disposed on the same plane can also show similar effects as does each of the above embodiments. Further, in another conceivable embodiment, the channel (that is, the oxide semiconductor layer) in each of the above embodiments may be formed on a base material or a substrate.

As described above, the above embodiments and experimental examples have been disclosed not for limiting the present invention but for describing these embodiments and experimental examples. Furthermore, modification examples made within the scope of the present invention, inclusive of other combinations of the embodiments, will also be included in the scope of the patent claims.

INDUSTRIAL APPLICABILITY

The present invention can be applied broadly to the fields of electronic devices including a mobile terminal, an information appliance, a sensor, or any other publicly known electric appliance including various semiconductor elements, MEMS (Micro Electro Mechanical Systems) or NEMS (Nano Electro Mechanical Systems), and medical devices, for example.

The invention claimed is:

1. A method of producing an oxide layer, the method comprising:
   an etching-mask forming step of forming a pattern of an etching mask including aliphatic polycarbonate on an oxide precursor layer by screen printing,
   a removing step of, after the etching-mask forming step, removing a portion of the oxide precursor layer not protected by the etching mask, and
   a heating step of, after the removing step, heating the etching mask and a portion of the oxide precursor layer protected by the etching mask to or above a temperature at which the oxide layer is formed.

2. A method according to claim 1,
   wherein the removing step comprises contacting the oxide precursor layer with a solution for dissolving the portion of the oxide precursor layer not protected by the etching mask.

3. The method of producing an oxide layer according to claim 2, wherein the heating step comprises heating the portion of the oxide precursor layer to cause decomposition of the aliphatic polycarbonate of the portion of the oxide precursor layer.

4. A method according to claim 1, wherein the removing step comprises exposing the oxide precursor layer to a plasma for etching the portion of the oxide precursor layer not protected by the etching mask.

5. The method of producing an oxide layer according to claim 4, wherein the heating step comprises heating the portion of the oxide precursor layer to cause decomposition of the aliphatic polycarbonate of the portion of the oxide precursor layer.

* * * * *